(12) United States Patent
Cronie et al.

(10) Patent No.: US 8,880,783 B2
(45) Date of Patent: Nov. 4, 2014

(54) DIFFERENTIAL VECTOR STORAGE FOR NON-VOLATILE MEMORY

(75) Inventors: Harm Cronie, Lausanne (CH); Amin Shokrollahi, Préverenges (CH)

(73) Assignee: Kandou Labs SA (CH)

( * ) Notice: Subject to any disclaimer, the term of this patent is extended or adjusted under 35 U.S.C. 154(b) by 187 days.

(21) Appl. No.: 13/464,849

(22) Filed: May 4, 2012

(65) Prior Publication Data

US 2013/0013870 A1    Jan. 10, 2013

Related U.S. Application Data

(60) Provisional application No. 61/504,515, filed on Jul. 5, 2011.

(51) Int. Cl.
*G06F 12/00* (2006.01)
*G11C 11/56* (2006.01)
*G06F 11/10* (2006.01)

(52) U.S. Cl.
CPC ........ *G06F 11/1068* (2013.01); *G11C 11/5642* (2013.01); *G11C 11/5628* (2013.01)
USPC ....................................................... 711/103

(58) Field of Classification Search
CPC ............ G06F 12/0246; G06F 11/1068; G11C 11/5628; G11C 11/5642
See application file for complete search history.

(56) References Cited

U.S. PATENT DOCUMENTS

| | | | |
|---|---|---|---|
| 3,196,351 A | 7/1965 | Sleplan | |
| 6,766,342 B2 | 7/2004 | Kechriotis | |
| 6,839,429 B1 | 1/2005 | Gaikwad et al. | |
| 7,180,949 B2 | 2/2007 | Kleveland et al. | |
| 7,746,764 B2 | 6/2010 | Rawlins et al. | |
| 8,009,471 B2 * | 8/2011 | Haines et al. | 365/185.03 |
| 8,176,235 B2 * | 5/2012 | Franceschini et al. | 711/103 |
| 8,321,775 B2 * | 11/2012 | Bueb | 714/799 |
| 2003/0071745 A1 | 4/2003 | Greenstreet | |
| 2006/0159005 A1 | 7/2006 | Rawlins et al. | |
| 2008/0273623 A1 | 11/2008 | Chung et al. | |
| 2009/0132758 A1 | 5/2009 | Jiang et al. | |
| 2009/0132895 A1 | 5/2009 | Jiang et al. | |
| 2011/0216588 A1 * | 9/2011 | Kim et al. | 365/185.03 |
| 2011/0235501 A1 | 9/2011 | Goulahsen | |
| 2011/0302478 A1 | 12/2011 | Cronie et al. | |
| 2012/0311407 A1 * | 12/2012 | Lee et al. | 714/768 |

FOREIGN PATENT DOCUMENTS

WO    2010/031824 A    3/2010

OTHER PUBLICATIONS

Abbasfar, A., "Generalized Differential Vector Signaling," *IEEE International Conference on Communications*, ICC '09, Jun. 14, 2009, pp. 1-5.

Bohossian, V. et al., "Buffer coding for asymmetric multilevel memory", *Proceedings of the International Symposium of Information Theory*, 2007, pp. 1186-1190.

(Continued)

*Primary Examiner* — Hiep Nguyen

(74) *Attorney, Agent, or Firm* — Invention Mine LLC

(57) ABSTRACT

A method is disclosed for storing information on non-volatile memory which can rewrite memory cells multiple times before a block needs to be erased. The information to be stored is transformed into a suitable form which has better robustness properties with respect to common sources of error, such as leakage of charge, or imperfect read/write units.

20 Claims, 34 Drawing Sheets

(56) References Cited

OTHER PUBLICATIONS

Dasilva, et al. "Multicarrier Orthogonal CDMA Signals for Quasi-Synchronous Communication Systems," *IEEE Journal on Selected Areas in Communications*, Jun. 1, 1994, vol. 12, No. 5, pp. 842-852.

Jiang, A. et al., "Floating codes for joint information storage in write asymmetric memories", *Proceedings of the International Symposium of Information Theory*. 2007, pp. 1166-1170.

Jiang, A. et al., "Rank Modulation for Flash Memories", *IEEE Transactions of Information Theory*, Jun. 2006, vol. 55, No. 6, pp. 2659-2673.

Slepian, D., "Permutation Modulation", *Proceedings of the Institute of Electrical Engineers, Institution of Electrical Engineers*. Stevenage, GB, Mar. 1, 1965, vol. 53, No. 3, pp. 228-236.

Wang, X. et al., "Applying CDMA Technique to Network-on-chip," *IEEE Transactions on Very Large Scale Integration (VLSI) Systems*, Oct. 1, 2007, vol. 15, No. 10, pp. 1091-1100.

International Search Report mailed Jul. 14, 2011 in International Patent Application S.N. PCT/EP2011/002170.

International Search Report mailed Oct. 10, 2012 in International Patent Application S.N. PCT/EP2012/062938.

\* cited by examiner

0
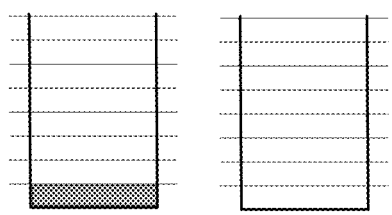
Fig. 22-a
1
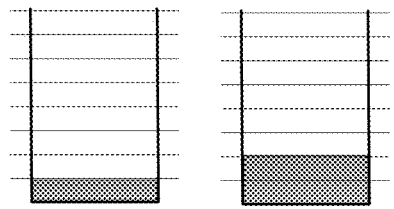
Fig. 22-b
0
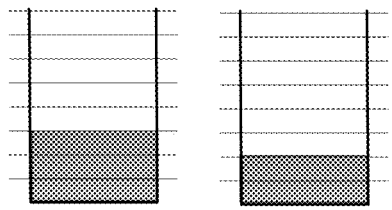
Fig. 22-c
1
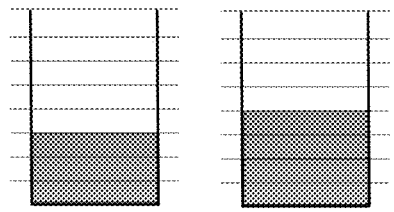
Fig. 22-d 0                       1
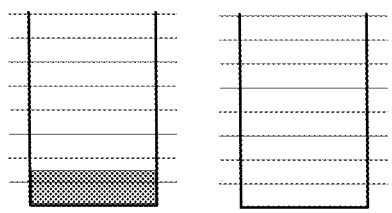 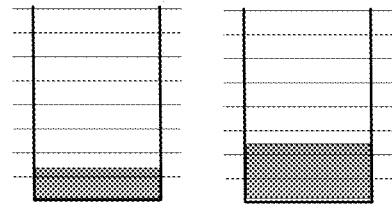
Fig. 23-a               Fig. 23-b
0                       1
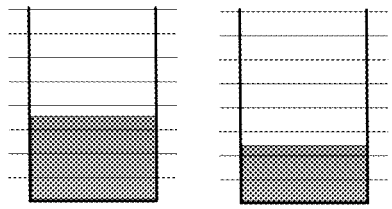 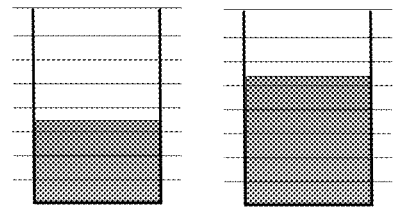
Fig. 23-c               Fig. 23-d 0110 --> 1 0 -1 0 0
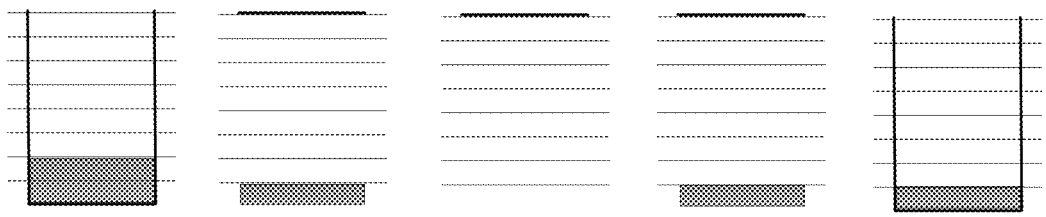
FIG. 32-a
1101 --> -1 0 0 1 0
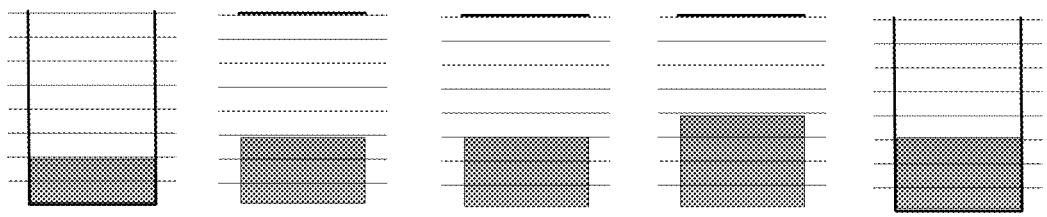
FIG. 32-b

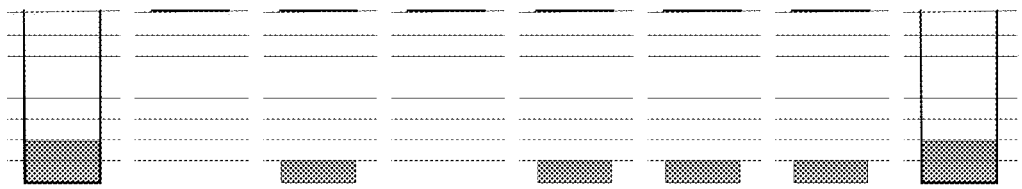
Fig. 33-a
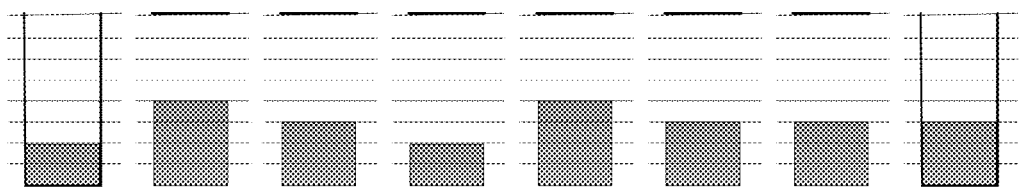
Fig. 33-b
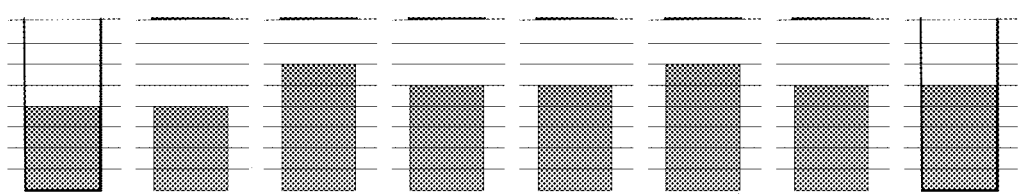
Fig. 33-c
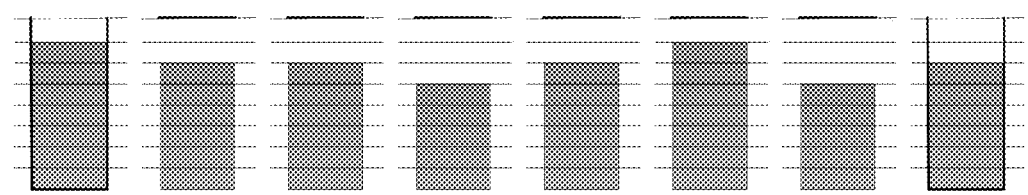
Fig. 33-d

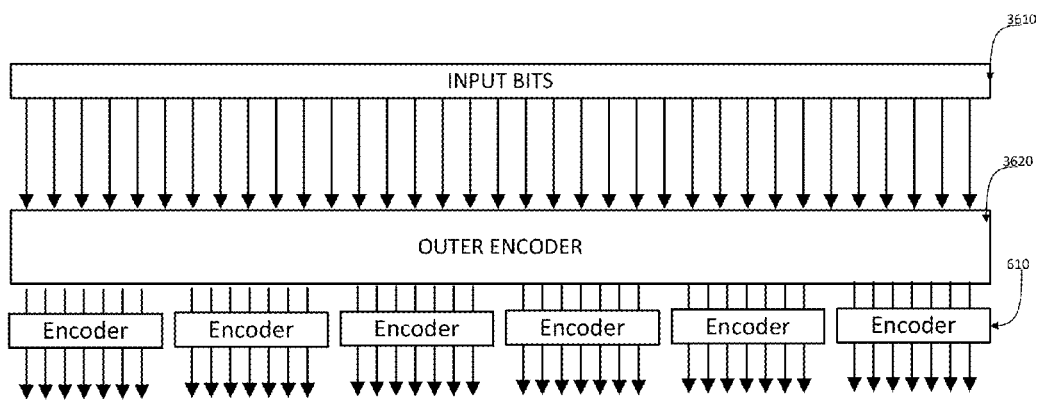
Fig. 36-a
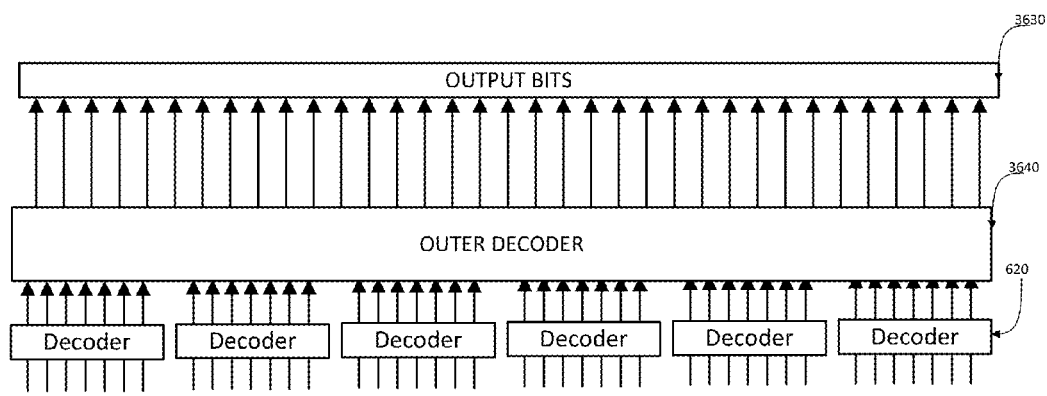
Fig. 36-b

DIFFERENTIAL VECTOR STORAGE FOR NON-VOLATILE MEMORY

CROSS REFERENCES

This application claims priority from and is a non-provisional of U.S. Provisional Patent Application No. 61/504,515, filed Jul. 5, 2011, entitled "Differential Vector Storage for Non-Volatile Memory", the entire disclosure of which is incorporated by reference herein for all purposes.

The following references are herein incorporated by reference in their entirety for all purposes:

U.S. patent application Ser. No. 12/784,414, filed May 20, 2010, naming Harm Cronie and Amin Shokrollahi, and entitled "ORTHOGONAL DIFFERENTIAL VECTOR SIGNALING" (hereafter referred to as "Cronie I").

U.S. patent application Ser. No. 12/982,777, filed Dec. 30, 2010, naming Harm Cronie and Amin Shokrollahi, and entitled "POWER AND PIN EFFICIENT CHIP-TO-CHIP COMMUNICATIONS WITH COMMON-MODE REJECTION AND SSO RESILIENCE" (hereafter referred to as "Cronie II").

U.S. patent application Ser. No. 13/030,027, filed Feb. 17, 2011, naming Harm Cronie, Amin Shokrollahi, and Armin Tajalli, and entitled "METHODS AND SYSTEMS FOR NOISE RESILIENT, PIN-EFFICIENT, AND LOW POWER COMMUNICATIONS WITH SPARSE SIGNALING CODES" (hereafter referred to as "Cronie III").

U.S. patent application Ser. No. 13/176,657, filed Jul. 5, 2011 naming Harm Cronie and Amin Shokrollahi, and entitled "Methods and Systems for Low-power and Pin-efficient Communications with Superposition Signaling Codes" (hereafter referred to as "Cronie IV").

REFERENCES

[Slepian] D. Slepian, "Permutation modulation," published in the proceedings of the IEEE, Vol. 53, No. 3, March 1965, pages 228-236.

[Jiang07] A. Jiang, V. Bohossian, and J. Bruck, "Floating codes for joint information storage in write asymmetric memories", published in the proceedings of the International Symposium on Information Theory 2007, pages 1166-1170.

[Bohossian] V. Bohossian, A. Jiang, and J. Bruck, "Buffer coding for asymmetric multilevel memory", published in the proceedings of the International Symposium on Information Theory 2007, pages 1186-1190.

[Jiang09] A. Jiang, R. Mateescu, M. Schwartz, and J. Bruck, "Rank modulation for flash memories," published in the IEEE Transactions on Information Theory, Vol. 55, No. 6, June 2009, pages 2659-2673.

FIELD OF THE INVENTION

The present invention relates to the structuring of information storage in memory units generally and more particularly to structuring of information storage into non-volatile memory devices.

BACKGROUND OF THE INVENTION

Non-volatile memory devices such as flash memory ("FM"), and to a lesser extent phase change memory ("PCM"), (collectively, "NVM" or non-volatile memory) are becoming increasingly popular and a real alternative to traditional devices such as hard disks. They retain the stored data as well as hard disks, but allow for much shorter access times. Moreover, they are not as susceptible to kinetic shock because of the absence of moving mechanical parts, and they allow for smaller form factors. For this, and other reasons, such devices, and in particular FM, are becoming the devices of choice for consumer grade devices such as mobile devices.

In FM, information is stored in cells in form of a trapped charge with very long leakage times (10 years or more). The charge in a cell can take one of several different levels, leading to single level or multilevel memory devices. In PCM, information is stored in the form of a state of a material. Such a state is often referred to as a phase and in PCM several discrete phases may be used to store information.

Flash memory is a subclass of electrically erasable programmable read-only memory ("EEPROM") that is erased and programmed in large blocks. It stores information in an array of memory cells made from floating-gate transistors. These cells can store one or multiple bits of information by encoding the information into the amount of charge trapped on the floating gate. Flash memory using one-bit cells is called a single-level cell ("SLC") device, and memory using multiple bits per cell is called a multi-level cell ("MLC") device.

Conventional Arrangement of NVM

FIG. 1 illustrates a general model of NVM storage showing a controller 110, a page read/write (R/W) module 120, and the physical cells 130 and their corresponding R/W modules. These units are connected by signal paths 140 and 142 which allow the transmission of information between these units. In applications, these units may occupy the same physical space, or they may be separated.

In application, these units may be integrated in the same device, or in some cases the controller 110 may be integrated in a different device than the R/W module 120 and physical cells 130. An example is the case where the controller 110 is integrated in a photo camera and the R/W module 120 and physical cells 130 are integrated on the flash card where photos are stored. Unless otherwise indicated, the positions of the R/W module, cells and controller, and the type of NVM used for the cells, is not critical to understanding the details.

FIG. 2 gives further details of the structure of the cell unit 130. The unit comprises further sub-units called pages and blocks. A page, denoted by 210 in the figure, coincides with a bitline within a block. A bitline, also denoted by 210 is a series of cells arranged in one line. Wires connecting cells within a column, denoted by 230, are called wordlines. A block 220 is illustrated comprising a number of pages. Typical sizes for pages are one to four kilobytes (KB), and typical sizes for blocks are 128, 256, or 512 KB. Other parameters are also possible and depend on applications.

In some flash technologies, such as the NOR flash, the bits in the cell module 130 can be written individually, whereas in other technologies, such as the NAND flash, the bits need to be written on a page basis. In all existing flash technologies, erasing needs to be done on a block basis, i.e., to erase a single bit, the entire block 220 needs to be erased, and then reprogrammed. Generally, a block needs to be erased if the charge of a single cell within the block needs to be lowered.

FIG. 3 gives a more detailed schematic of a page. As shown there, each page might comprise cells 310 of the physical entities holding charges, and electronics used to read and write these charges. In flash memory, the charge stored on a cell alters the physical properties of the cell and the electronic components read the charge by measuring voltages or currents in the cell that depend on this physical property. When a floating gate transistor is used the amount of charge stored on the floating gate changes the threshold of the transistor. This change may be measured by the electronics. The cells are connected via the bitline 320 which in many embodiments in practice are physical wires.

The structure of an example conventional cell is further detailed in FIG. 4, showing an electronic component 410, called the R/W unit, which is responsible for reading and writing symbols from and to cell 420, which contains the actual charge. The role of the R/W Module 410 is to read the charge level in cell 420, and transform it into the bit or sequences of bits represented by that charge. Another role of the R/W Module is to change the charge level of the cell in order to change the bit or bit sequence represented by that charge.

In general, the electronics involved in the R/W Module is capable of sensing the amount of charge in cell 420, and transform this into tangible information consisting of zeros and ones. In a SLC, the charge in a cell represents only one bit. The absence of a charge, or a very low amount of charge, could be interpreted as a logical "zero", whereas a high level of charge could be interpreted as a logical "one". In a MLC, charges can have more than two states.

For example, in a situation where the charge level represents two bits, the absence of a charge, or a very low level of charge, could represent the sequence "00", a charge level of 0.25 of the maximum charge level (or a charge level close to this) could represent the sequence "01", a charge level of half the maximum charge level (or a charge level close to that) could represent the sequence "10", and a charge level close to maximum could represent the sequence "11."

Other interpretations of sequences based on charge levels are of course also possible and, unless otherwise indicated, are not critical to the understanding of the basic functioning of an MLC flash device. A flash device storing three bits per cell would have to compare charge levels to an absolute reference that has a resolution of one-eighth of the maximum charge level, and four bits per cell would translate to comparing charge levels to an absolute reference that has a resolution of one-sixteenth of the maximum charge level.

In a flash device, charges can only be changed in one direction until erasing occurs. For the purposes of this disclosure, and for keeping the technical discussions simple, we assume that charges can only be added to the cell. In a practical implementation, the opposite may be the case, i.e., cells start with their maximum charge, and charges are subtracted from the cell until the charge of the cell is zero, but it is to be understood that both methods are equivalent as far as the description of this invention disclosure is concerned, and that the teachings of this disclosure are equally applicable to both methods.

Once the charge of a cell reaches its maximum value, the cell cannot be rewritten anymore. At this point, the cell's content needs to be erased, and a new charge needs to be injected into the cell, representing the information. Because of the specifics of connections of bitlines and wordlines in a flash device, erasing the content can only be done on the level of a block. This slows down the speed of the write operation. Moreover, the erase operation leads to a wear of the cells, and to accelerated leakage of charge over time. Typically, the manufacturer of a flash device indicates a number of P/E (Program-Erase) cycles that a device can endure before becoming unreliable. For SLCs, this number is in the range of 100,000, whereas for MLCs, it may be as low as 5,000.

Since every write operation on a block increases the level of at least one cell in the block, this means that writing a single bit on a block of an SLC leads to a full erase of the block (on average). In order to increase the lifetime of a device, controller 110 may implement countermeasures that include leveling the wear of the various blocks by applying load balancing methods. The wear is more pronounced for MLCs, since hitting the various levels requires careful programming of charge injection, and an overshoot results in a complete erase of the block. The programming cycle needs to cautiously approach the target charge level from below, which translates into many programming cycles and will only work when the number of bits stored per cell is not large. In addition to the programming issue, MLCs also suffer from less reliability, as low memory endurance may cause a drift of threshold levels in ageing devices and hence lead to programming and read errors.

For these reasons, researchers have been looking for methods and means to rewrite cells multiple times before erasing the cell (and hence the block containing the cell). For example, [Jiang07] and some of the references cited therein introduce a scheme, called "floating codes", which group multiple cells together to jointly record and rewrite the cells, using the controller to keep track of the number of times a cell has been rewritten. A similar technique is employed in "buffer codes" disclosed in [Bohossian]. While these techniques effectively increase the number of times cells are rewritten, in all such schemes, and more generally, in all schemes inspired by write-once-memory techniques, the charges of the different cells do not relate to one another, and it is important to program the charge levels exactly in order to enjoy the benefits of the system. Moreover, accurate references need to be generated to compare the charge levels (or proxies thereof, such as voltage or current levels) against. Moreover, gradual wear of the cell, which leads to faster leakage of charges over the lifetime of the device, could substantially impede the operation of these techniques.

A different technique that does not suffer from many of the disadvantages of the previous schemes called "rank modulation coding" has been disclosed in [Jiang09]. In this scheme, a group of cells jointly store a number of bits of information. The information is modulated via a unique permutation given by the levels of charge in the cells. The permutation defined by the charge levels in the cells is given by the permutation obtained by sorting the charge levels from top to bottom (or bottom to top—there is no significant difference).

For example, if the charge levels are 0, 1, 2, and 3, and the charges in the cells are given by 1, 0, 3, and 2, then the corresponding permutation could be (0,1)(2,3), in the standard cycle notation for permutations. If the next sequence of bits corresponds to a permutation (0,1,2,3), for example, then one could add a charge of four units to the first cell, a charge of two units to the second cell, and a charge of two units to the last cell, resulting in charge levels of [5,2,3,4]. By sorting, it can be seen that the permutation corresponding to these charges is (0,1,2,3). What is therefore important for the teachings of [Jiang09] is the relative ordering of the charges in the cells, not the absolute values of these charges.

This makes it unnecessary to have a common reference for the cells, and also, it makes it unnecessary to have exact charge levels applied to the cells. Moreover, if the cells "deflate" at similar rates, i.e., if they suffer from similar leakage properties, then the ordering of the cells stays the same and the information is not lost. However, a big disadvantage of this scheme is the complexity of rewriting.

[Jiang09] gives a number of approaches to this problem which are based on finding Gray codes in the permutation group, and are not easily implementable in practice, as they need a quick way of encoding a sequence of bits to a unique permutation, and a way of changing one permutation to another by adding a very small amount of charge to the cells. While rank modulation coding leads to a number of advantages for flash memory devices, such as an increase in the endurance of the device, resilience to common leakage of the cells, lack of efficient processes to encode the bits into charge levels, and to change the charge levels according to the incoming bit patterns makes the scheme difficult to use in practice.

Given the state of memory storage, improvements are needed.

BRIEF SUMMARY

In any non-volatile memory system in which information is stored by charge levels in cells and in which it is feasible to obtain information about the ordering of charge levels within a group of cells, information can be stored differentially using the differences between charge levels of cells rather than the absolute values of the charges. In a non-volatile memory, a single cell can be rewritten multiple times before a block erase becomes necessary, using this approach. In addition, when more than one bit is stored on average in a cell, the precision required for writing can be much relaxed, allowing for a non-volatile memory with higher reliability and more rewritable before wearing out, as well as allowing for faster write operations. In a specific implementation, multiple bits are read and a codeword is derived and used for storing the representation of those multiple bits.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included figures.

BRIEF DESCRIPTION OF THE DRAWINGS

Various embodiments in accordance with the present disclosure will be described with reference to the drawings in FIG. 1 through FIG. 37.

DETAILED DESCRIPTION

Improved methods for storage on a flash system are described herein. These methods are collectively called "differential vector storage" methods hereinafter. Some of these methods provide for transforming information given by sequences of bits into charge levels across multiple cells such that cells can be rewritten multiple times before an erase cycle, can store more than one bit on average in a cell, do not need to have a common reference for the cells for reading and writing information, are resilient to common leakage of the cells, and provide efficient processes for transforming bits into charge levels and charge levels across multiple cells into bits.

Figure 5:
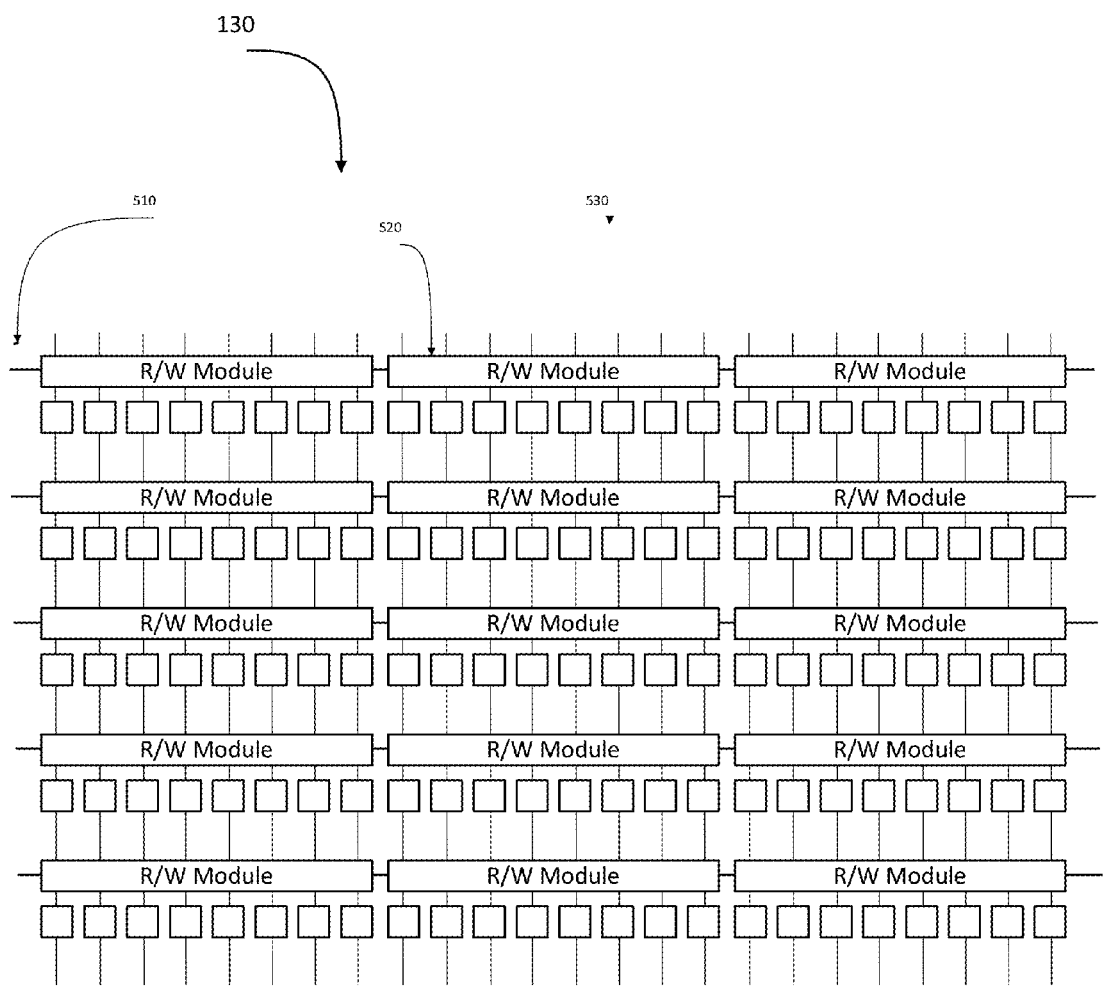

FIG. 5 illustrates a structure of a cell unit 130 that might be used in a memory storage device according to one embodiment of the present invention. Several cells 530 within a page are grouped into one unit 520 called a "fundamental group of cells." These cells have a common R/W Module 520 that reads the charges of the cells in a fundamental group, controls the charges in the individual cells, and is responsible for writing and reading these charges. In this embodiment, the charges within the cells are not independent of one another, but follow an encoding rule, thereby providing a number of advantages described herein.

Figure 6:
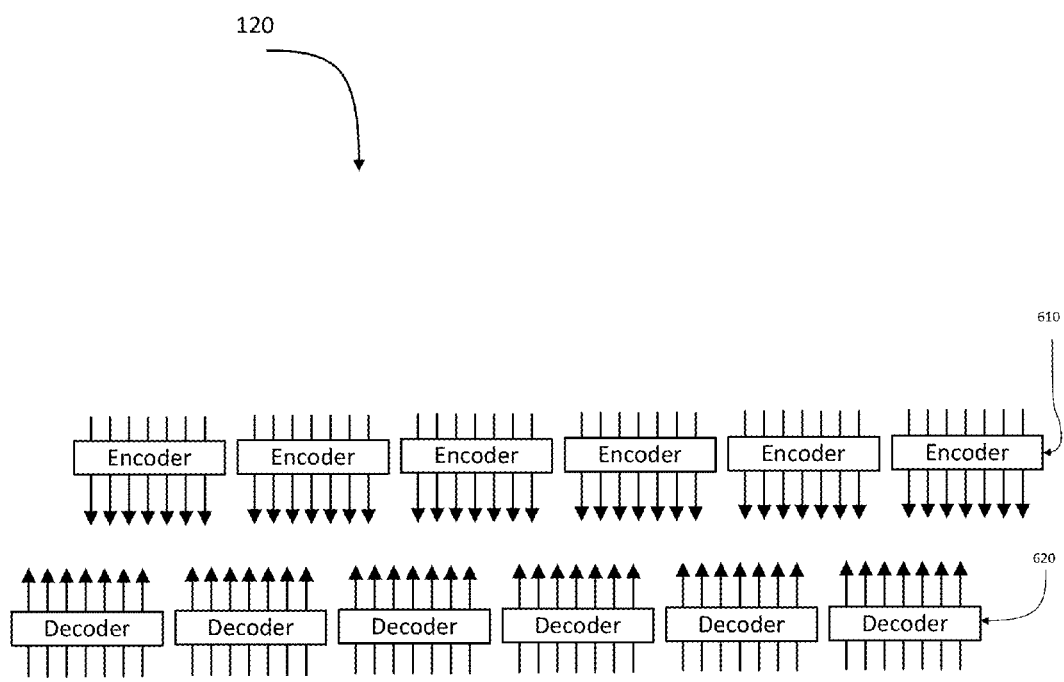
Figure 9:
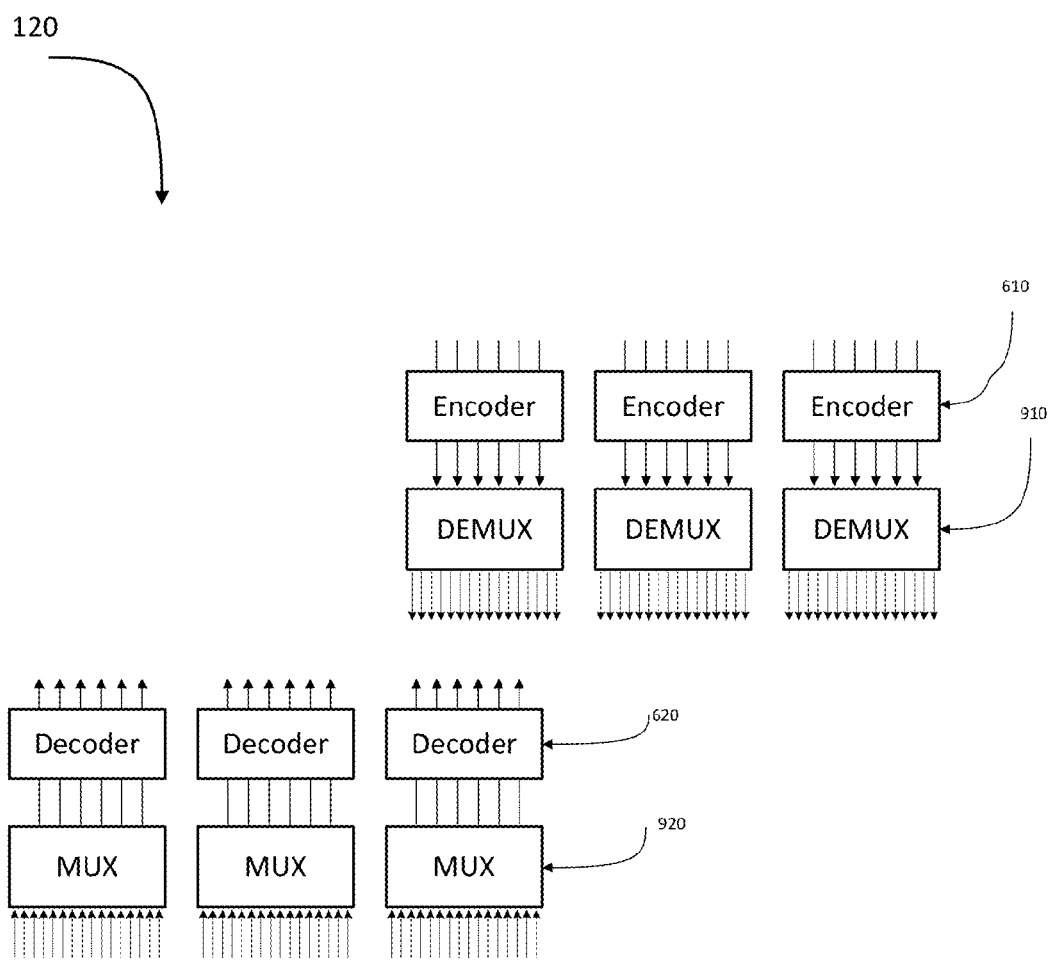

The logical block and page structures are maintained, and reading the actual bits represented by the charges within each group of cells is accomplished by the page R/W 120, whose operation is further detailed in FIGS. 6 and 9.

The structure of the page R/W unit 120 according to one of the embodiments of the present invention is exemplified in FIG. 6. The R/W unit comprises a number of encoders 610, one for each fundamental group of cells, and a number of decoders 620, one for each fundamental group of cells. The input to decoder 620 is the sequence of charges of each of the cells in the corresponding fundamental group of cells, or a proxy for the charges, such as voltages or currents. The output of the decoder is a sequence of bits represented by those charges.

Similarly, the input to encoder 610 is a sequence of bits, and the output is a sequence of real numbers, represented by voltages or currents, one for each cell in the fundamental group of cells. The number of encoders/decoders in this embodiment is the number of fundamental groups within each page.

Figure 7:
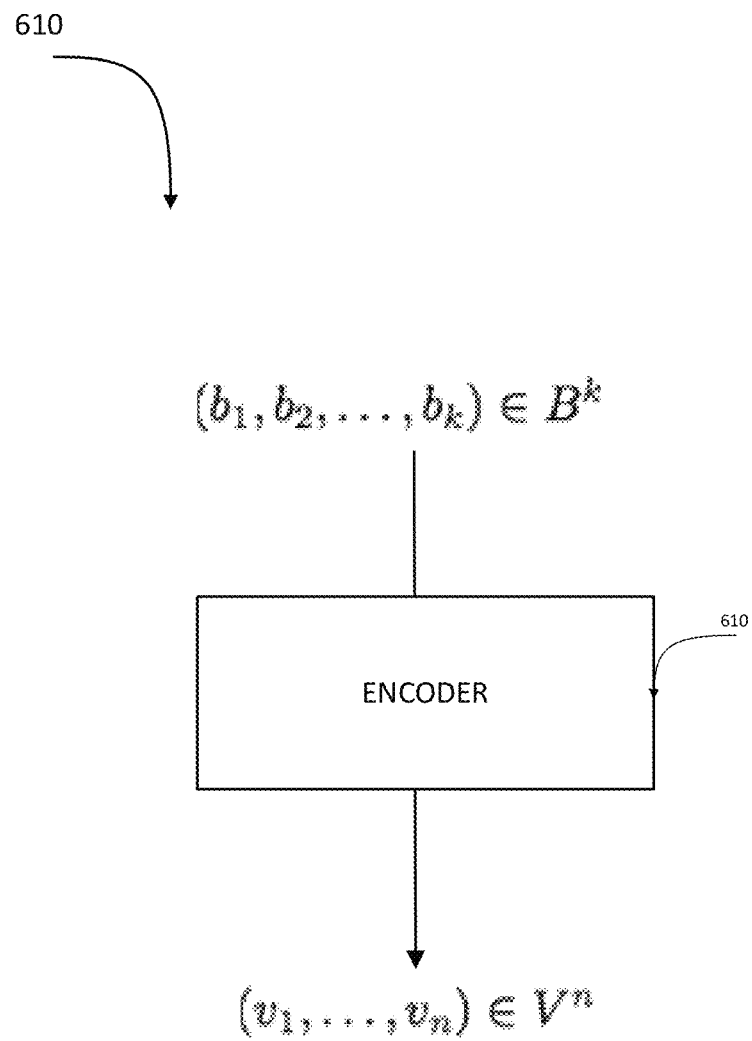

The input/output behavior of encoder 610 is further detailed in FIG. 7. The input to the encoder is a vector of values $(b[1], \ldots, b[k])$ wherein each $b[j]$ belongs to a bit alphabet, B. The bit alphabet could be a two-element alphabet, logically equivalent to $\{0,1\}$. The output of the encoder is a vector of values $(v[1], \ldots, v[n])$ wherein each $v[j]$ belongs to an encoder alphabet, V. In preferred embodiments, the encoder alphabet is a subset of the set of real numbers, and can contain negative values. The set of all possible values $(v[1], \ldots, v[n])$ is called the "code" of the encoder and n is called the "length" of the code. The "size" of the code is the number of vectors in the code. The elements of a code are called "codewords." A code is called "trivial" if it consists of all possible combinations of components of the encoder alphabet V, i.e., if it is equal to $V^n$.

Example codes suitable for differential vector storage have the property that every codeword has at least two components that are equal, and such that no multiple of one codeword is equal to another. Such codes are collectively referred to as "differential storage codes" hereinafter. The first condition allows for the resistance of codewords with respect to common leakage of cells within a fundamental group of cells, whereas the second condition often allows for efficient encoding and decoding procedures. Further reasons for the suitability of such codes for storage will become apparent upon further study of this disclosure.

In preferred embodiments, the differential storage code has the property that for each vector in the code the sum of the entries of the vector is a constant, for example zero. Such vectors are called "neutral" hereinafter, and a differential storage code comprising only neutral vectors is referred to as a "neutral code." The neutral code may form a set with certain desirable properties.

In some embodiments, that neutral code is made up of permutations of a single vector. Such a set is called a permutation modulation (PM) code, and has been described in [Slepian]. Efficient encoding and decoding processes for such codes and their use for bus communications have been described in Cronie II and Cronie III. In some embodiments, the neutral code may be a superposition of PM codes, as described in Cronie IV. In preferred embodiments of the present invention, encoder 610 is equipped with an efficient process to compute its output based on its input.

Special cases of encoders 610 are known, for other uses. For example, an encoder for an SLC flash drive may output a value for each cell, wherein the value can take one of two different choices, corresponding to whether a bit zero or a bit one is to be written on its corresponding cell. An encoder for an MLC flash drive may output values that belong to an alphabet of size four, corresponding to two bits per cell, or the values may belong to an alphabet of size eight, corresponding to three bits per cell. In such cases, the code corresponding to the encoder is saturated. What distinguishes the operation of the encoder according to various embodiments of the current invention is that the encoder outputs values for a group of cells wherein the group contains more than one cell, and the code corresponding to the encoder is not saturated.

It is also known for the encoder to implement an error-correcting code. In such encoders, the encoder operates on a group of cells and the code corresponding to the encoder is not saturated and has an encoding alphabet limited to non-negative values, corresponding to charges to be written on the cells.

Figure 8:
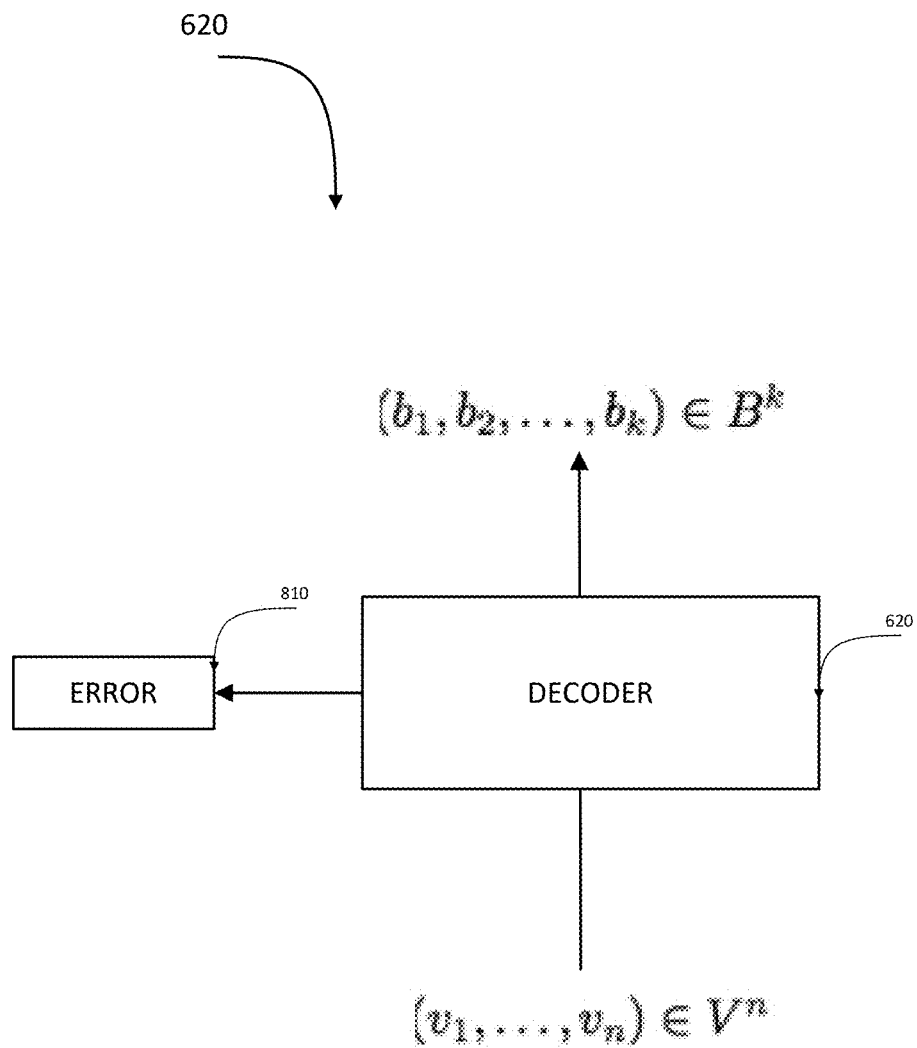

The input/output behavior of a decoder 620 is exemplified in FIG. 8. The main operation of decoder 620 is the inverse of that of encoder 610. Upon reception of an element of the code, given by the vector $(v[1], \ldots, v[n])$, decoder 620 calculates the corresponding element with entries in the bit alphabet, i.e., $(b[1], \ldots, b[k])$. In some embodiments, decoder 620 may further flag an error, given by unit 810, if the input vector $(v[1], \ldots, v[n])$ does not belong to the code corresponding to encoder 610. This introduces the possibility of error detection.

Another embodiment of the page R/W unit 120 is exemplified in FIG. 9. It comprises a number of encoders 610 and a number of DEMUX units 910. The incoming bits into encoder 610 may arrive at a higher speed and may be encoded at line speed. The DEMUX unit 910 uses the analog values generated by encoder 610 and distributes them on the fundamental groups of cells associated with it. The number of DEMUX units can be as small as one. The page R/W 120 according to this embodiment also comprises decoders 620 and MUX units 920. One task of the MUX unit is to collect the charges gathered from the fundamental groups of cells associated with it, and feed them to associated decoder 620 at a higher speed. One of the advantages of this embodiment is a more economical usage of electronic components comprising the encoder and decoder units.

In some embodiments, the page R/W unit 120 may simply comprise one or more MUX/DEMUX units, without further need for encoding or decoding. This is exemplified with reference to FIG. 10. The charge read by the R/W modules in 130, or proxies thereof such as voltages or currents, could be directly transported on the bus 1030 between the flash memory device and a peripheral unit, such as a processor. The peripheral unit 1010 is equipped with an I/O unit 1020 that is capable of decoding the received charges into bits, or encoding bits received from the peripheral device 1020 into charges, or proxies thereof, which are then transmitted to the flash memory device via bus 1030, and DEMUXed into the various fundamental groups of cells within unit 130.

Figure 10:
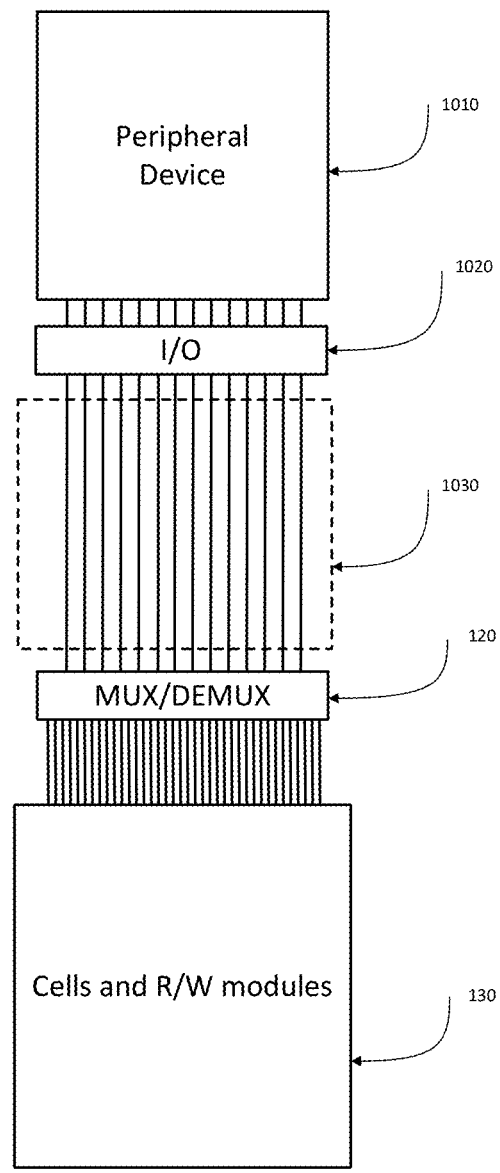

This setup may require an amplifier, or other peripheral circuitry to clean up and amplify the signals received from communication bus 1030 (omitted from FIG. 10 for clarity). Such a setup is particularly useful when the charges read from cells within a fundamental group are suitable for transmission on bus 1030. In some embodiments, these charges, or their proxies, may be those obtained from encoding and decoding methods disclosed in Cronie I-III.

Figure 11:
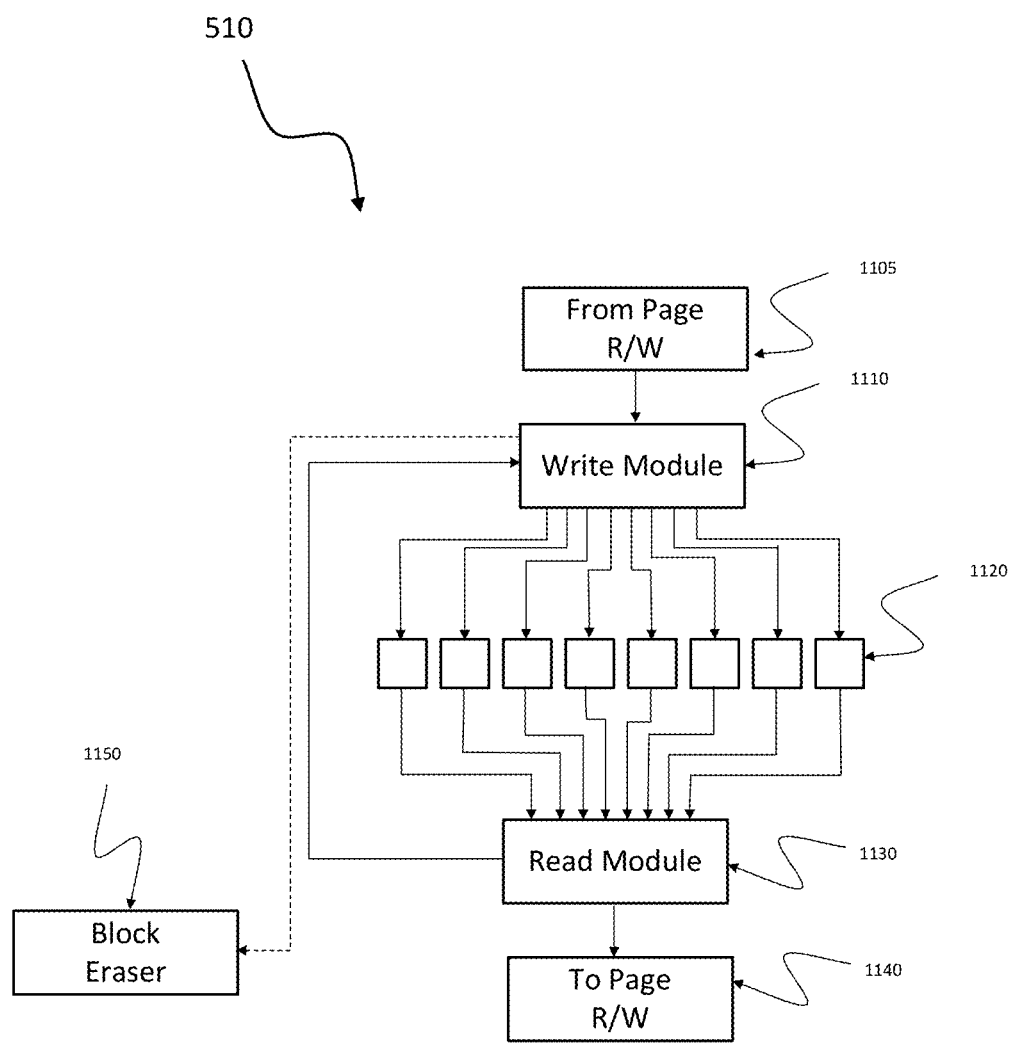

The operation of examples of R/W modules 510 are now further described with reference to FIG. 11. Each of the R/W modules 510 may comprise two parts, a write module 1110, and a read module 1130. These modules may have access to the cells 1120 in a fundamental group. The Write Module 1110 accepts as input values coming from Page R/W 1105. These values could correspond to analog data representing the bits to be written on the cells 1120.

When a write operation is requested of Write Module 1110, the latter instructs the Read Module 1130 to read the charge levels of the cells and provide the Write Module 1110 with a vector of values over a suitable alphabet. Further, Write Module 1110 may calculate for the given sequence of values a possibly different vector of values of the same size as the one provided by Read Module 1130.

An operation is performed on these two vectors that is elaborated on below. A number of nonnegative charges are calculated, one for each cell, and this charge is added to the cell value if permissible. If not, then the whole block is erased by Block Eraser Unit 1150. Optionally, the Read Module 1130 also outputs a sequence of values corresponding to bits represented by the cell charges.

Figure 12:
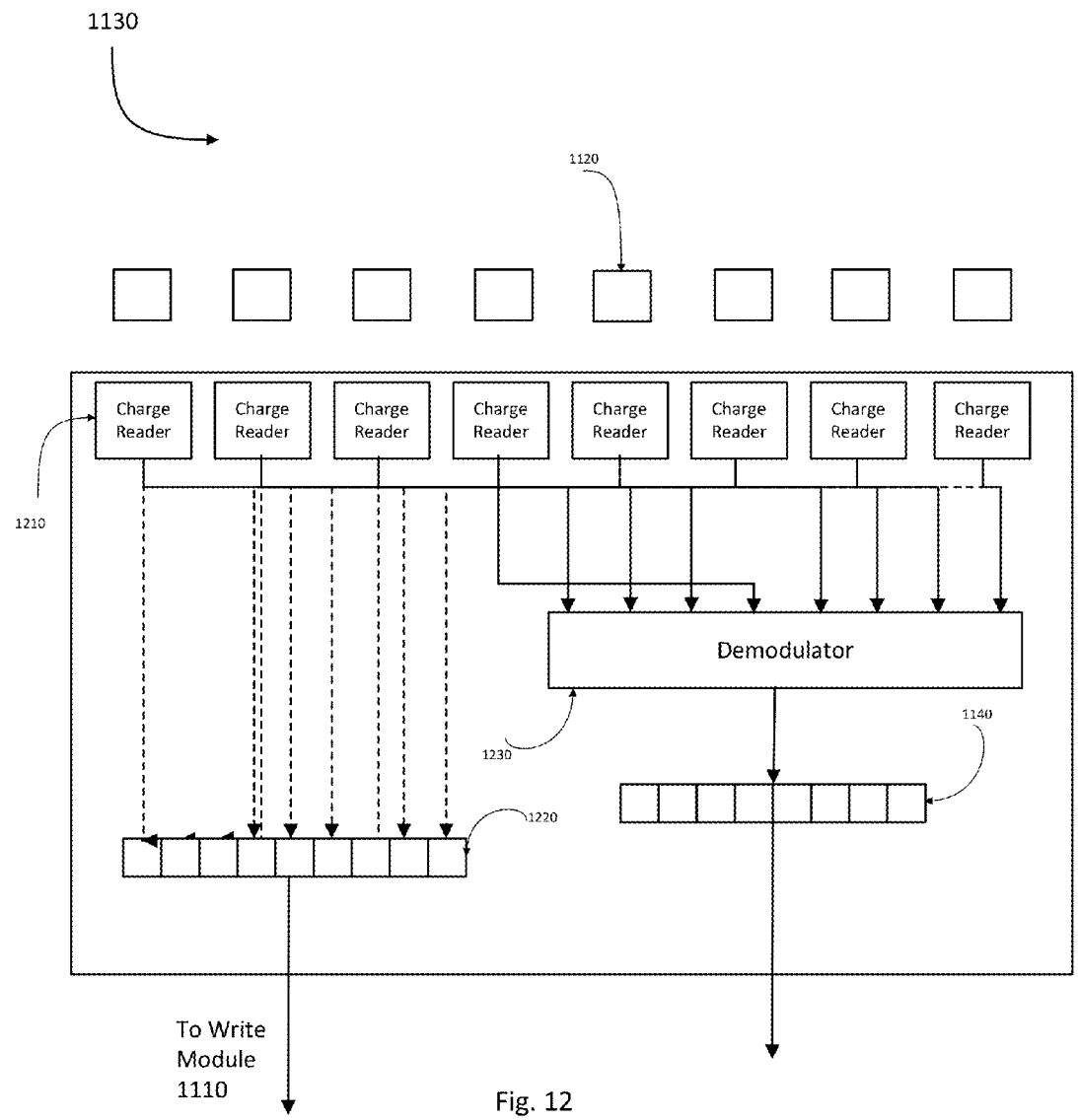

The operation of Read Module 1130 according to one of the embodiments is further exemplified with reference to FIG. 12. It comprises a series of Charge Readers 1210, and a Demodulator 1230. In this embodiment, there is one Charge Reader per cell 1120 in a fundamental group of cells. One task of Charge Readers 1210 is to read the charge levels of their corresponding cells, and to feed these charges, or proxies thereof, into the Demodulator 1230. Depending on whether the read operation is requested by the Write Module 1110 of FIG. 11 or not, the charges read by Charge Readers 1210 are either directly forwarded to Write Module 1110 as a vector 1220 of values, or they are demodulated to produce a possibly different vector 1140 of value which may be forwarded to the Page R/W Unit 120.

Figure 13:
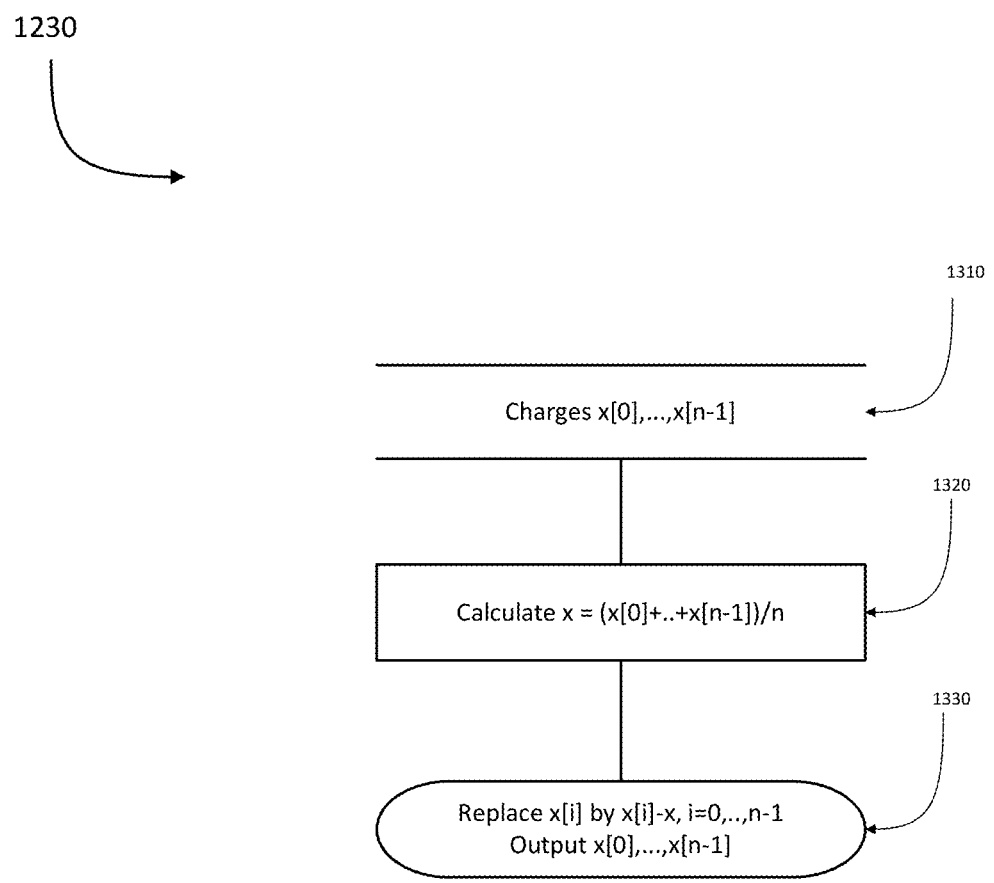

An exemplary embodiment of the process underlying the operation of demodulator 1230 is detailed in FIG. 13. The demodulator is fed with values $x[0], \ldots, x[n-1]$ of charges in 1120. In Step 1320, demodulator 1230 calculates the average of these values, called x, and in step 1330, this value is subtracted from each of the values $x[i]$. The resulting values are output to Write Module 1110.

Figure 14:
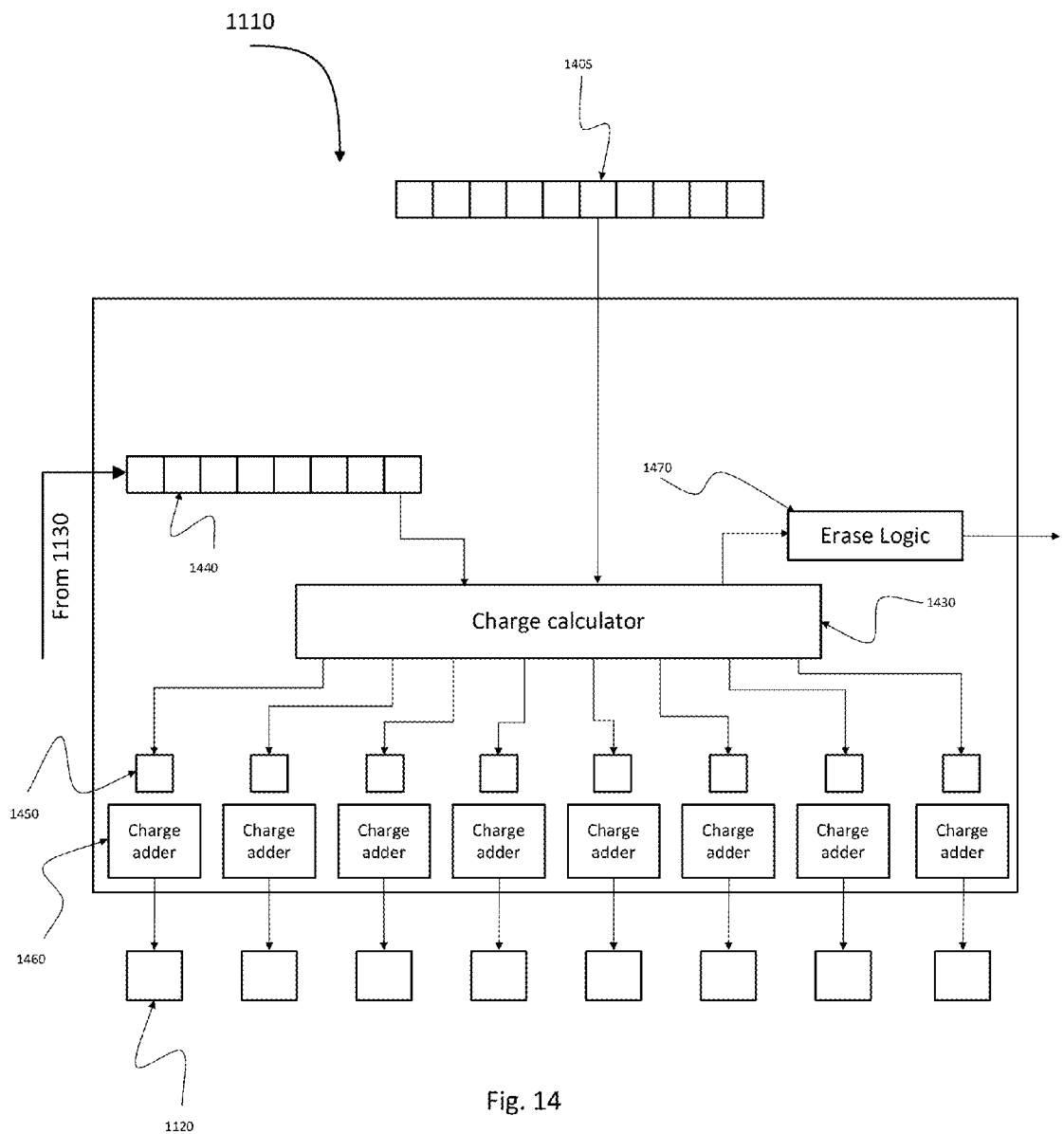

The operation of an example Write Module 1110 is exemplified according to FIG. 14. It comprises a Charge Calculator 1430, charge adders 1460, input sequence 1440, and erase logic 1470. Input sequence 1440 is the output of Read Module 1130. The sequence 1405 of values belonging to the encoder alphabet which may have been computed by the encoder units 610 in FIG. 6, and the sequence 1440 are fed into Charge Calculator 1430 that calculates for each of the cells 1120 in a fundamental group of cells a nonnegative charge level. These levels are applied to the cells 1120 using charge adders 1460. The erase logic 1470 erases the entire block before writing if it sees that any of the charge levels are bigger than the max charge level.

An exemplary operation of the Charge Calculator 1430 is now described with reference to FIG. 15. An important parameter for the operation of the Charge Calculator 1430 is the "minimum charge increment", denoted by e. In applications, the minimum charge increment is the smallest charge difference between two cells that can be detected by the electronics components in the Read Module 1130, and such that Write Module 1110 is capable of injecting this charge increment into the cells.

Another important parameter for measuring the endurance of the memory devices when operated as described herein is the "relative charge quotient" defined as the quotient of Q by e, wherein Q is the maximum charge level in a cell. For example, if a cell can maximally contain a charge corresponding to 1000 electrons, and if the electronic components responsible for reading and writing charge levels are capable of detecting a charge difference of 50 electrons, and are capable of injecting 50 electrons into a cell, then the relative charge quotient is 20.

Figure 15:
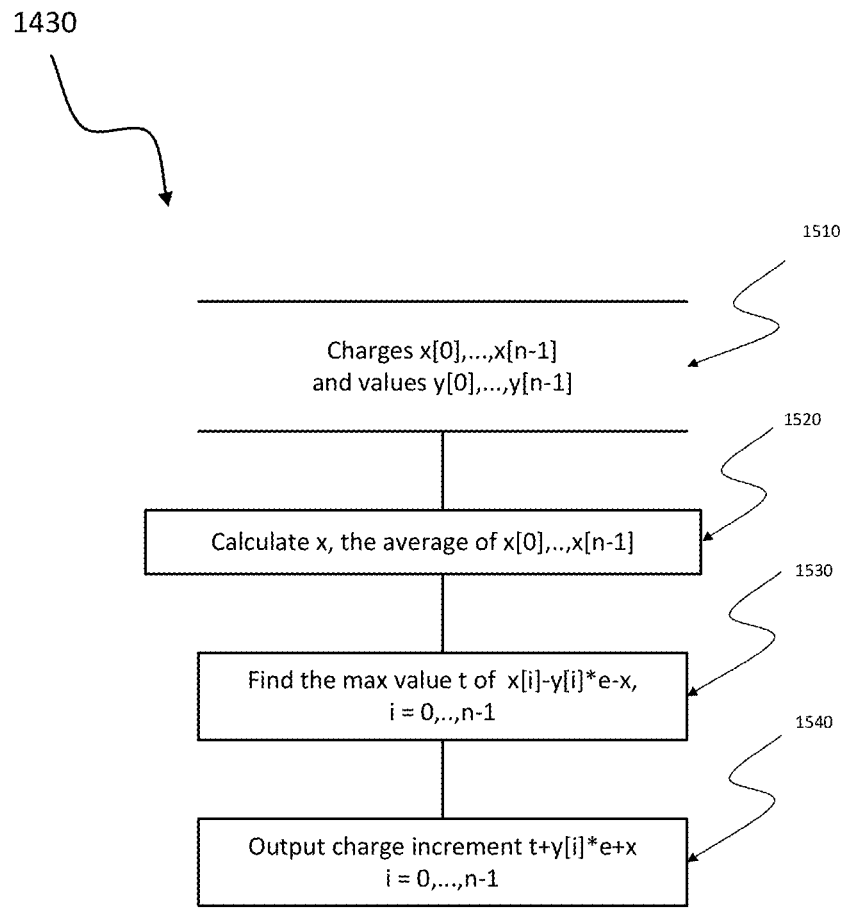

Continuing with the description of FIG. 15, the values $x[0], \ldots, x[n-1]$ represent the vector 1220 of FIG. 12 of charges forwarded by the Read Module 1130. The vector $(y[0], \ldots, y[n-1])$ belongs to a neutral code, which may have negative coordinates. It corresponds to vector 1405 in FIG. 14. In this example, it should be assumed that the sum of the entries $y[0]+\ldots+y[n-1]$ is zero, but any other fixed number might be used instead. In Step 1520, the average x of the values $x[0], \ldots, x[n-1]$ is calculated, and in Step 1530, the maximum of the values $x[0]-y[0]*e-x, \ldots, x[n-1]-y[n-1]*e-x$ is calculated. This maximum is called t herein. Thereafter, in Step 1540 the charges are calculated. The charge of cell i is augmented by the value $t+y[i]*e+x$, wherein e is the minimum charge increment. As can be appreciated by one of skill in the art upon reading this disclosure, the charges calculated by the process of FIG. 15 are always at least equal to the charges of the corresponding cells, so that this process never need remove any charge.

Parameters of Differential Vector Storage

In various embodiments, several of the parameters of a storage device are improved upon. These parameters include the endurance of the device, and the density. Below, "Rewrite Endurance" of a scheme refers to the number of times a cell can be rewritten in the worst case before a block erase becomes necessary. We denote by "Cell-efficiency" the average number of bits stored in a cell.

For traditional SLC flash devices the Rewrite Endurance is one, and the Cell-efficiency is one as well. For traditional MLC devices, the Rewrite Endurance is one, and the Cell-efficiency is two. For traditional Three-Level-Cell (TLC) devices, the Rewrite Endurance is one, and the Cell-efficiency is three. In traditional terms, a Rewrite Endurance of E will increase the number of Program/Erase cycles of a flash device by a factor of E, since only one out of E writes leads to a block erase.

Using techniques described herein, storage schemes and systems with higher rewrite endurance and higher cell efficiency are provided. For example, in some systems described herein, every write operation leads to an average charge increase of $1*e$, wherein e is the minimum charge increment, and 1 is an integer depending on the storage scheme. In such a case, the Rewrite Endurance is $R/1$, wherein $R=Q/e$ and is the relative charge quotient and is the maximum possible value for the Rewrite Endurance.

Differential Vector Storage of Cell Efficiency ½

A first example of a storage method is now presented with reference to FIG. 16 through FIG. 23-d. This example is for demonstration purposes only, and is highlights operation of some embodiments of the present invention. In this example, two cells are used to store one bit. This scheme is called "Differential Storage" hereinafter.

Figure 16:
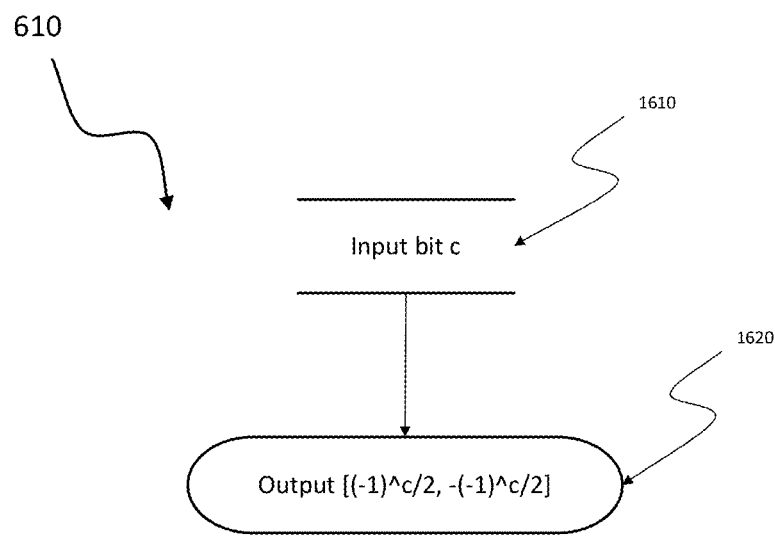

FIG. 16 outlines a procedure for encoder 610 of FIG. 6 for differential storage. The encoder is fed with the bit c in Step 1610, wherein c is either 0 or 1. Its output, in Step 1620, is the vector $[(-1)^c/2, -(-1)^c/2]$. So, if c is 0, then the output is $[½, -½]$, and if c is 1, then the output is $[-½, ½]$. The code for this encoder consists of the vectors $[½, -½]$ and $[-½, ½]$ and so is a neutral code of size 2 and length 2. This code is called the 1B2C hereinafter.

Figure 17:
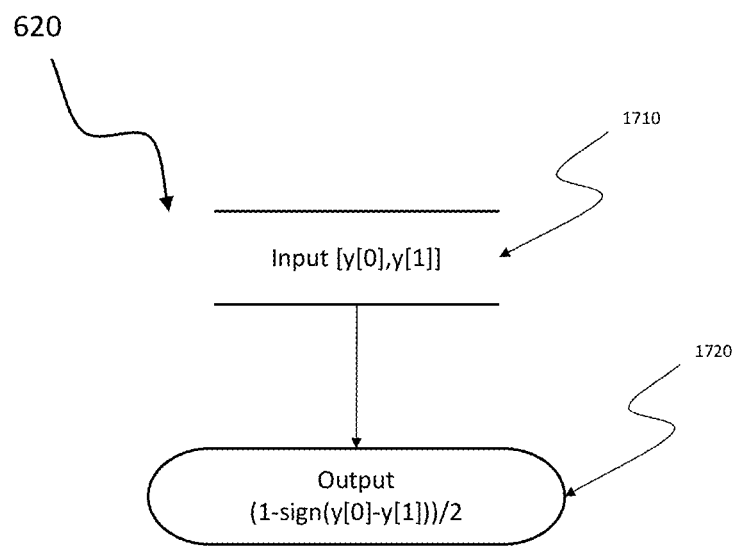

The operation of a decoder 620 according to this embodiment of the present invention is given in FIG. 17. The decoder 620 is presented with its input, a vector $[y[0], y[1]]$ in Step 1710. Its output, in Step 1720, is $(1-\text{sign}(y[0]-y[1]))/2$, wherein $\text{sign}(x)$ is the sign of the real number x. So, if the input is such that $y[0]>y[1]$, then the output is 0, and if $y[0]<y[1]$, then the output is 1. It is easy to see that the operation of the decoder according to FIG. 17 is the inverse of the operation of the encoder in FIG. 16, which means that if the output of the encoder in FIG. 16 is given as input to Decoder in FIG. 17, then the original input of the encoder is obtained.

Figure 18:
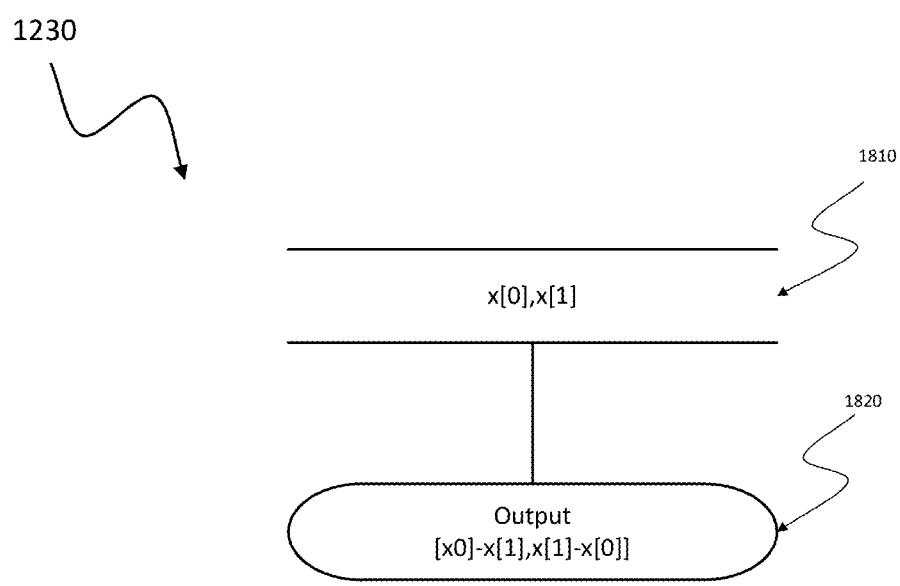

FIG. 18 exemplifies the operation of a demodulator 1230 of FIG. 12 in the case of a differential storage. The charges $x[0], x[1]$ are input into the differential demodulator in Step 18, and the output of the differential demodulator, in Step 1820, is the vector $[x[0]-x[1], x[1]-x[0]]$.

Figure 19:
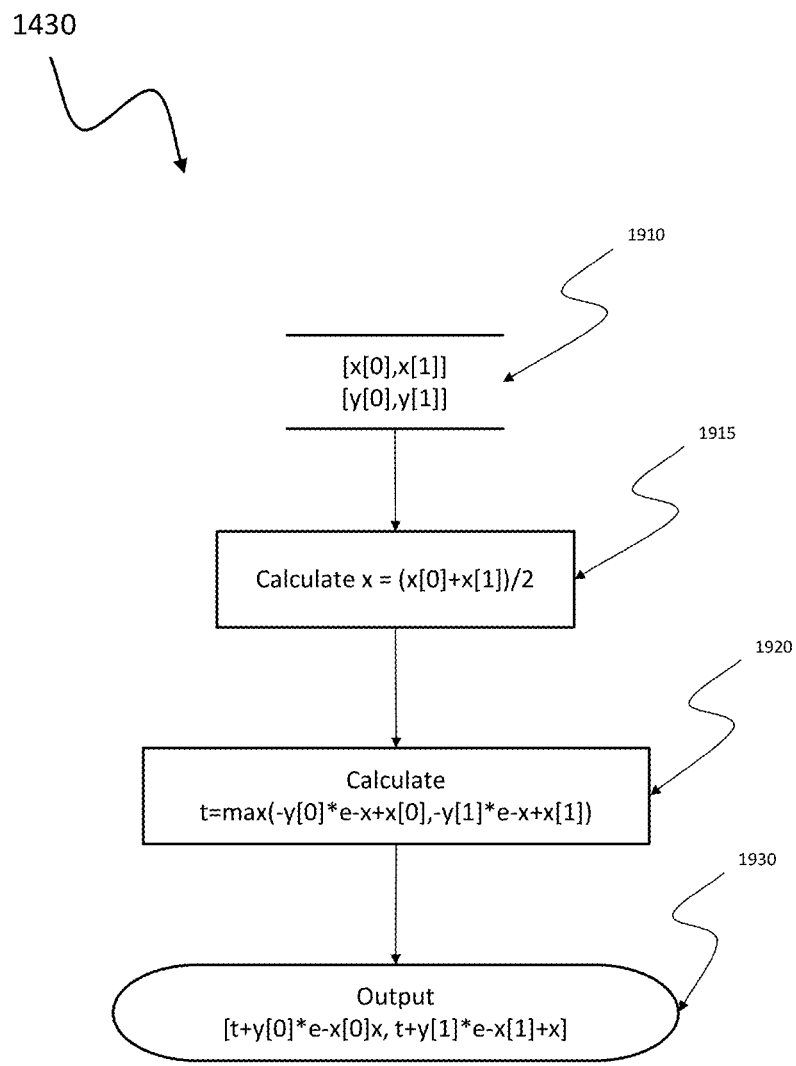

FIG. 19 exemplifies the operation of a charge calculator 1430 for differential storage. This is a special case of the procedure in FIG. 15. The input to this process is a vector $[x[0], x[1]]$ of charges, and a vector $[y[0], y[1]]$ belonging to the 1B2C code. In Step 1915 the average x of the values $x[0]$ and $x[1]$ is calculated. In Step 1920 the number t is calculated as the maximum of the two numbers $-y[0]*e-x+x[0]$ and $-y[1]*e-x+x[1]$. The output, given in Step 1930, is the vector of charges $[t+y[0]*e-x[0]+x, t+y[1]*e-x[1]+x]$.

Figure 20:
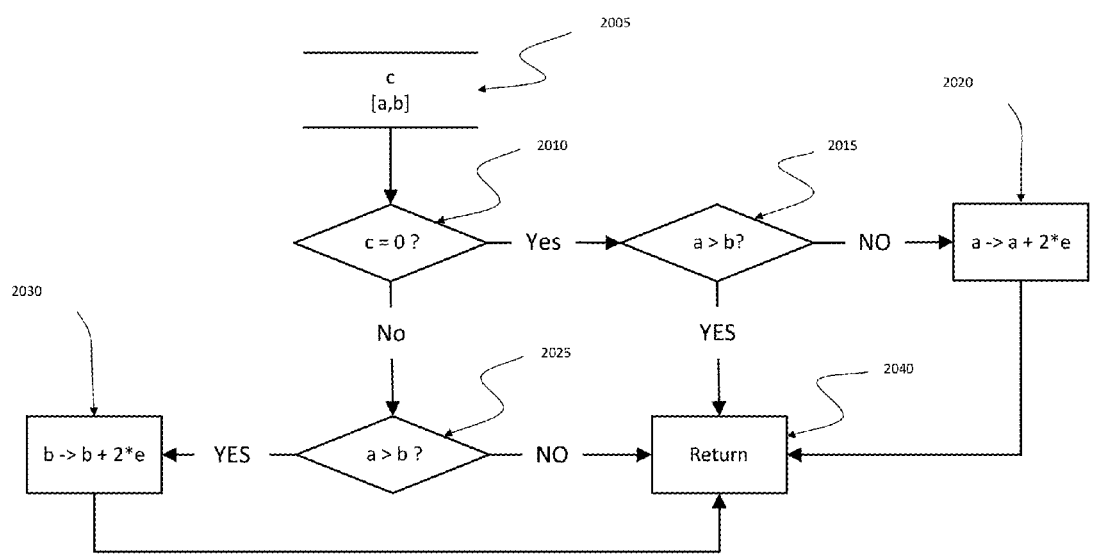

A flowchart detailing the combined operation of the Encoder 610 and the charge calculator for differential storage is exemplified in FIG. 20. The input to this process is the bit c, given as 0 or 1, and the vector [a,b] of charge levels of the two corresponding cells. Step 2010 tests whether c is 0. If this is the case, then in Step 2015 it is tested whether charge a is larger than charge b. If this is not the case, then the charge of the first cell is augmented by $2*e$, and the charge of the second cell is left unchanged. If a is already bigger than b, then nothing is done. If the result of the test in Step 2010 is negative, i.e., if c is 1, then the test in Step 2015 is repeated in Step 2025. If a is larger than b, then charge of the second cell is augmented by $2*e$, and the charge of the first cell is left unchanged. If a is not larger than b, then nothing is performed.

Figure 21:
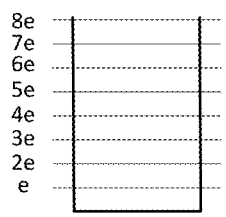

The operation of differential storage is now exemplified with reference to FIG. 21 and FIG. 22-a through 22-d. FIG. 21 shows the different charge levels of a cell during the operation of differential storage. In this example, the relative charge quotient is 8, which means that the total charge of a cell is 8 times larger than the minimum charge increment e.

FIG. 22-a shows the charge level at the first storage of the bit 0. The charge of the left cell is increased to e, while the charge of the right cell is unchanged. This corresponds to the output 1930 of FIG. 19. In this case $x[0]=x[1]=x=0$, $y[0]=½$, $y[1]=-½$, $t=e/2$, and the charge of the first cell is $e/2+e/2=e$ while the charge of the second cell is $e/2-e/2=0$. In FIG. 22-b the value of the bit 0 is changed to bit 1. In this case $x[0]=e$, $x[1]=0$, $x=e/2$, $y[0]=-½$, $y[1]=½$, and the value of t is the maximum of $e/2-e/2+e$ and $-e/2-e/2+0$, which is e. The output charge increments are $e-e/2+e/2=e$, and $e/2+e/2+e=2*e$. In FIG. 22-c the value of the bit 1 is changed back to a 0. In this case $x[0]=e$, $x[1]=2*e$, $x=3*e/2$, $y[0]=½$, $y[1]=-½$. The value of t is the maximum of $-e/2-3*e/2+e=-e$ and $e/2-3*e/2+2*e=e$, so it is equal to e. The output charge increments are $e+e/2-e+3*e/2=2*e$ and $e-e/2-2*e+3*e/2=0$, leading to the charges of $3*e$ and $2*e$ in the two cells. Finally, in FIG. 22-d the value of the bit is changed from zero to one, leading to charge increments 0 and $2*e$ and to the final charges $3*e$ and $4*e$ in the two cells.

It is easily seen that the differential storage given above has a Rewrite Endurance of R, where R is the relative charge quotient. This is because in every write operation the average charge of the cells is increased by e, and hence in the worst case after R write operations one of the cells has charge Q, which means that a block erase becomes necessary at the next write operation.

Imperfect Charge Increments

One of the many advantages of differential vector storage is that the injection of the charges into the cells does not need to be completely exact, as long as the relative ordering of the cells is preserved. This is demonstrated for the case of differential storage with reference to FIG. 23-a through 23-d.

The sequence of bits written to the cells is the same as in FIG. 22. In the example given in FIG. 23-a, the charge of the first cell is not exactly e, but slightly larger due to possible imperfections of the electronic components injecting the charge. The charge increments leading to the situation in FIG. 23-b may also not be perfect, so that after the second write operation the sequence of charges in the two cells is not [e,2*e], but something slightly larger (or smaller) than e, and slightly larger (or smaller) than 2*e.

As long as the first cell has a smaller charge than the second, and as long as this is detectible by the electronic components reading the charges, this imperfection will have no effect on the reliability of the stored bit. Especially when the cell-efficiency is larger than one, as will be described later in the document, this type of storage leads to more reliable bits, and provides for faster read and write operations since no external reference is necessary for comparing the charges against. It is assumed that the same reasoning on imperfect charge injection is included implicitly with all the schemes described in this disclosure.

Differential Storage of Cell Efficiency One

In practical situations, a cell efficiency of ½ may not be very desirable, even if the Rewrite Endurance is increased by a factor R. A different scheme is now described in which the cell efficiency is increased to 1, and the Rewrite Endurance is R/3. Such a scheme may be desirable in practice to replace SLC storage in flash devices. For example, where the maximum charge of a cell corresponds to 1000 electrons, and where the minimum charge increment is a charge corresponding to 20 electrons, the charge quotient R is equal to 50, and with the scheme described below the endurance of the SLC device may be improved 16.67 times. This means that using current technology, the number of P/E cycles could be increased from 100,000 (which is typical for SLC devices) to over 1,600,000, which leads to SLCs having better reliability than enterprise grade hard disks. In addition, in some practical embodiments, the new scheme may provide resilience against charge leakage.

Figure 24:
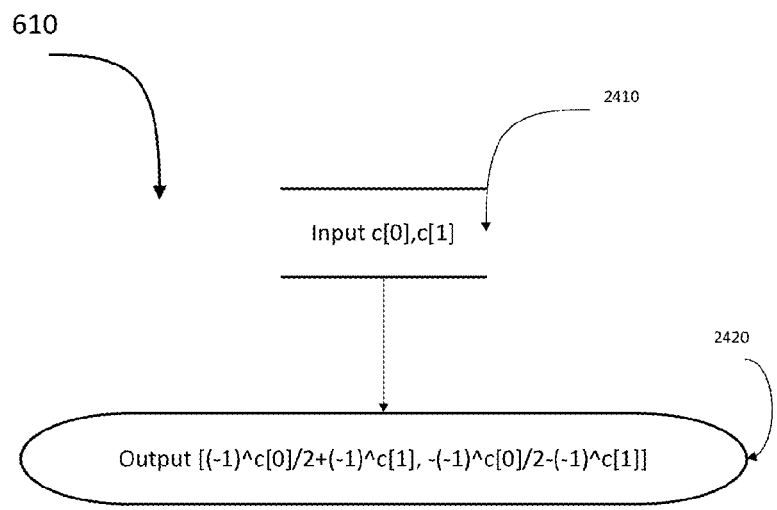

An exemplary encoder for this new scheme is given with reference to FIG. 24. The input to this process are two bits c[0], c[1], and the output is the vector shown in Equation 1.

$$\left[\frac{(-1)^{c[0]}}{2} + (-1)^{c[1]}, -\frac{(-1)^{c[0]}}{2} - (-1)^{c[1]}\right] \quad \text{(Eqn. 1)}$$

The code comprises the vectors [−3/2,3/2], [−½,½], [½,−½], and [3/2,−3/2] and is referred to herein as "the 1B1C code."

Figure 25:
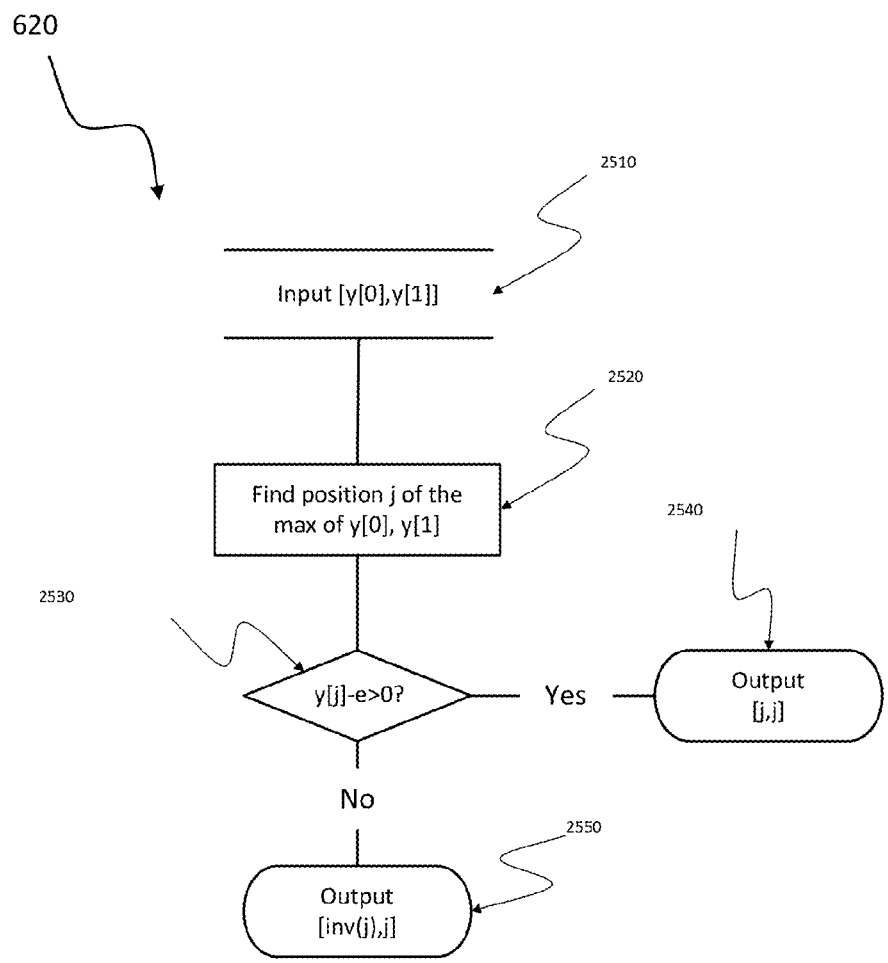

An exemplary decoder for the new scheme is given with reference to FIG. 25. The input to this process are two real values [y[0], y[1]]. In Step 2520 the position j of the maximum of these two values is determined. Next, in Step 2530 it is tested whether y[j]>e, wherein e is the minimum charge increment. If so, then the output of this process is [j,j], and if not, then the output is [inv(j),j], wherein inv(j) is the negation of the bit j. As is appreciated by the reader, the decoder is the exact opposite of the encoder in that if the output of the encoder is given to the decoder, then the output of the combined procedure is the input to the encoder. The charge calculator in this case may be the one outlined in FIG. 15. As can be appreciated by the reader, the cell efficiency of this scheme is 1, and the Rewrite Endurance of the scheme is R/3, since at every stage the average charge increment calculated by the procedure in FIG. 15 is at most 3*e. As one of moderate skill in the art will recognize, the 1B1C code is an example of a superposition signaling code as taught for chip-to-chip communications in Cronie IV.

Example of a Differential Vector Storage of Cell Efficiency 0.75

A new procedure is now described for storing an average of 0.75 bits per cell according to one embodiment of the above teachings. It should be understood that the various procedures described herein can be implemented with hardware components, programmable components of other methods to physically implement the procedure, but for clarity, repetition of such implementation details are omitted.

In this procedure, the fundamental group of cells contains 8 cells, and 6 bits are collectively stored in these 8 cells. The code used for this scheme is a PM code generated by the vector [−½,−½,−½,−½,½,½,½,½] consisting of 8 entries with exactly four entries equal to one and four equal to minus one. There are 70 such vectors, and to encode 6 bits into one such vector we only need 64 of these vectors. This code is called the 6B8C code hereinafter.

Figure 26:
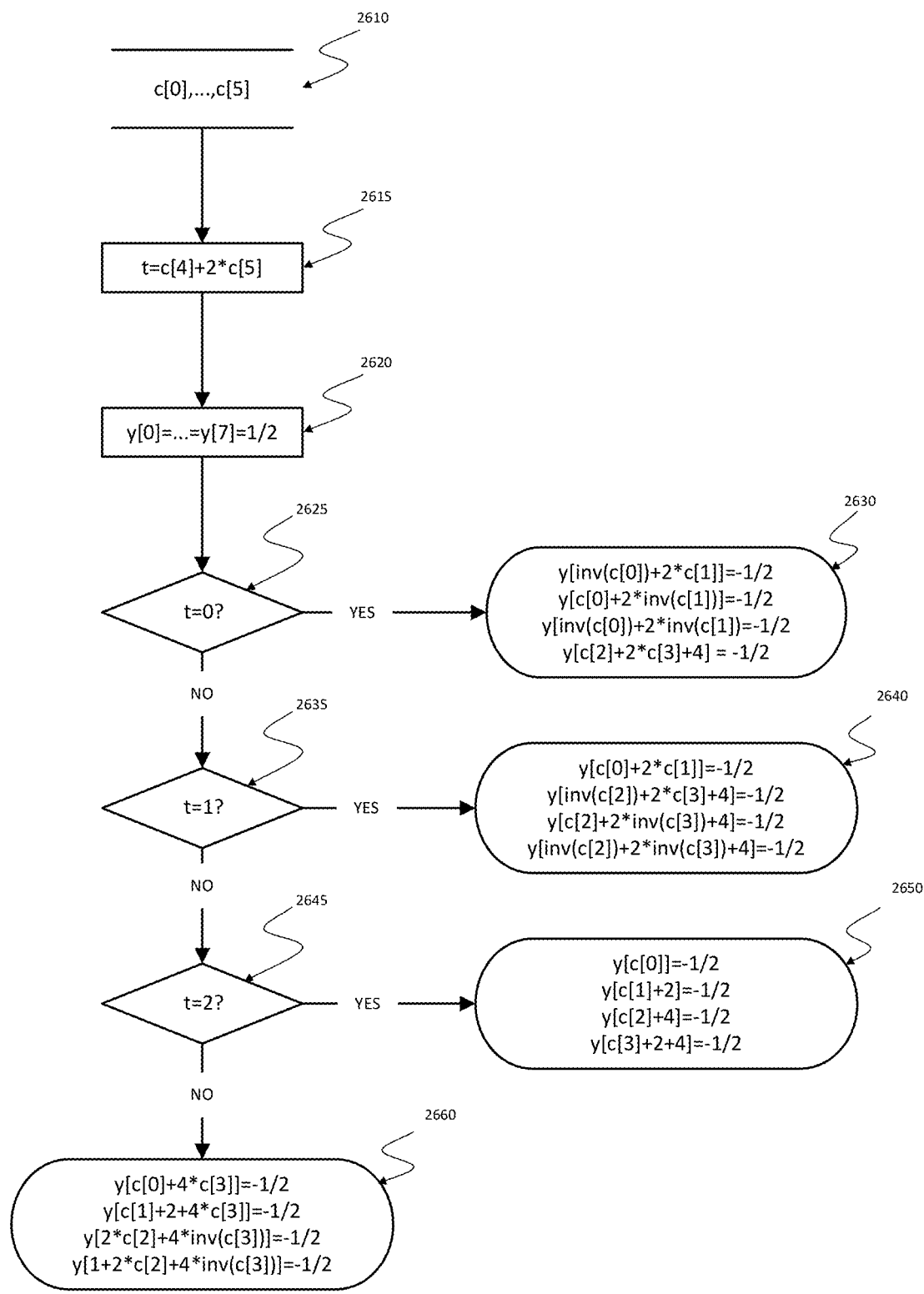

An encoding procedure for the 6B8C code is described according to FIG. 26 which, given 6 input bits c[0], c[5], uniquely computes a vector (y[0], y[7]) in the PM code. In Step 2615, a parameter t is calculated according to t=c[4]+2*c[5], and in Step 2620, the output vector is initialized to ½ in all positions. If t=0, then the positions of the vector y are set to −½ according to the assignments in Step 2630. If t=1, these values are set according to the assignments in Step 2640. If t=2, then these values are set according to the assignments in Step 2650, and if t=3, they are set according to the assignments in Step 2660. For example, if the original sequence of bits is equal to [0,1,1,0,1,0], then the output vector y is equal to [½, ½, −½, ½, −½, ½, −½, −½]. As another example, if the original sequence of bits is equal to [1,1,0,1,0,0], then the output vector y is equal to [−½, −½, −½, ½, ½, ½, −½, ½]. It should be understood that the mechanism for computing the values as described herein might be circuitry that calculates corresponding values on the fly, perhaps as signals, and/or calculates values ahead of time.

Figure 27:
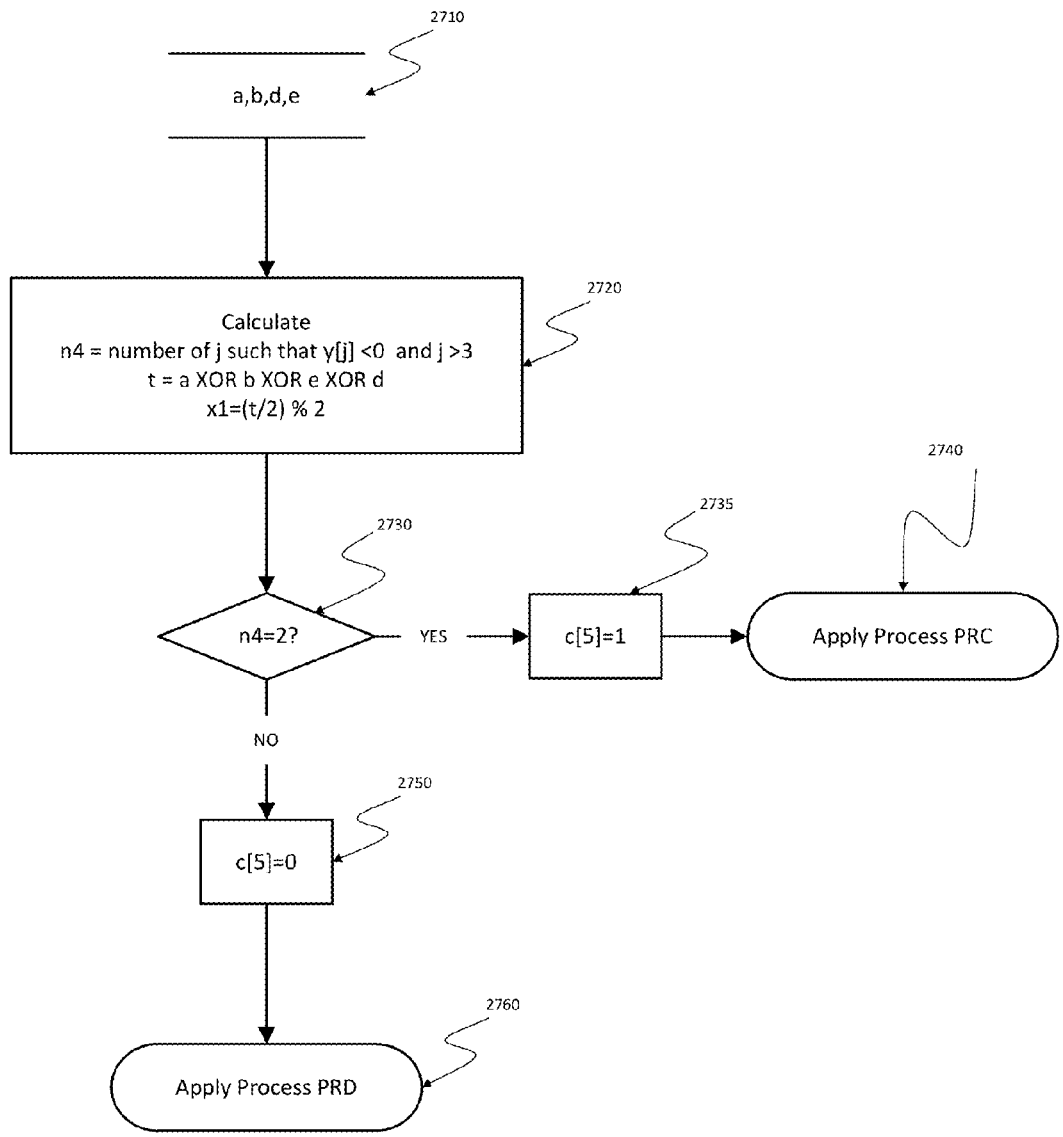
Figure 28:
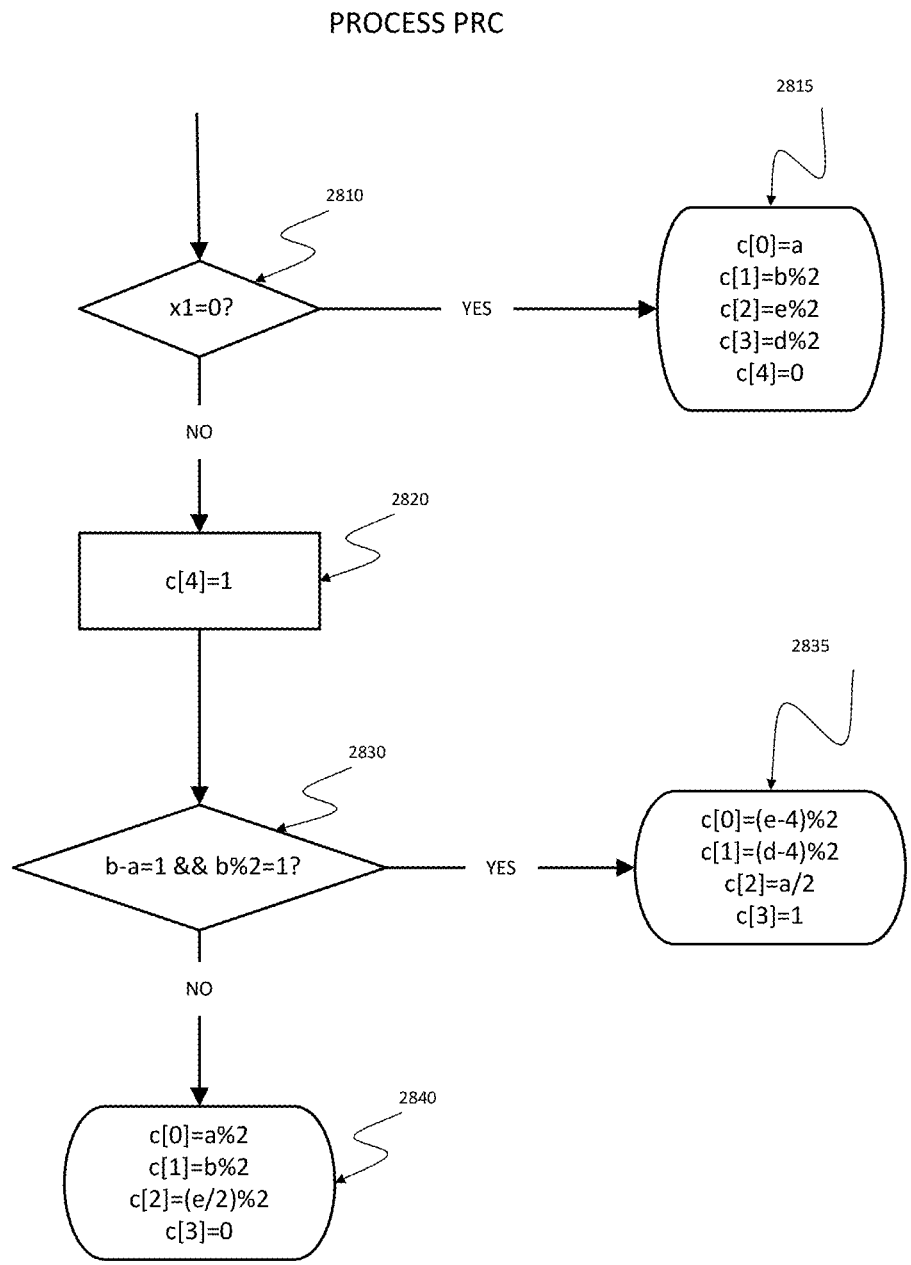
Figure 29:
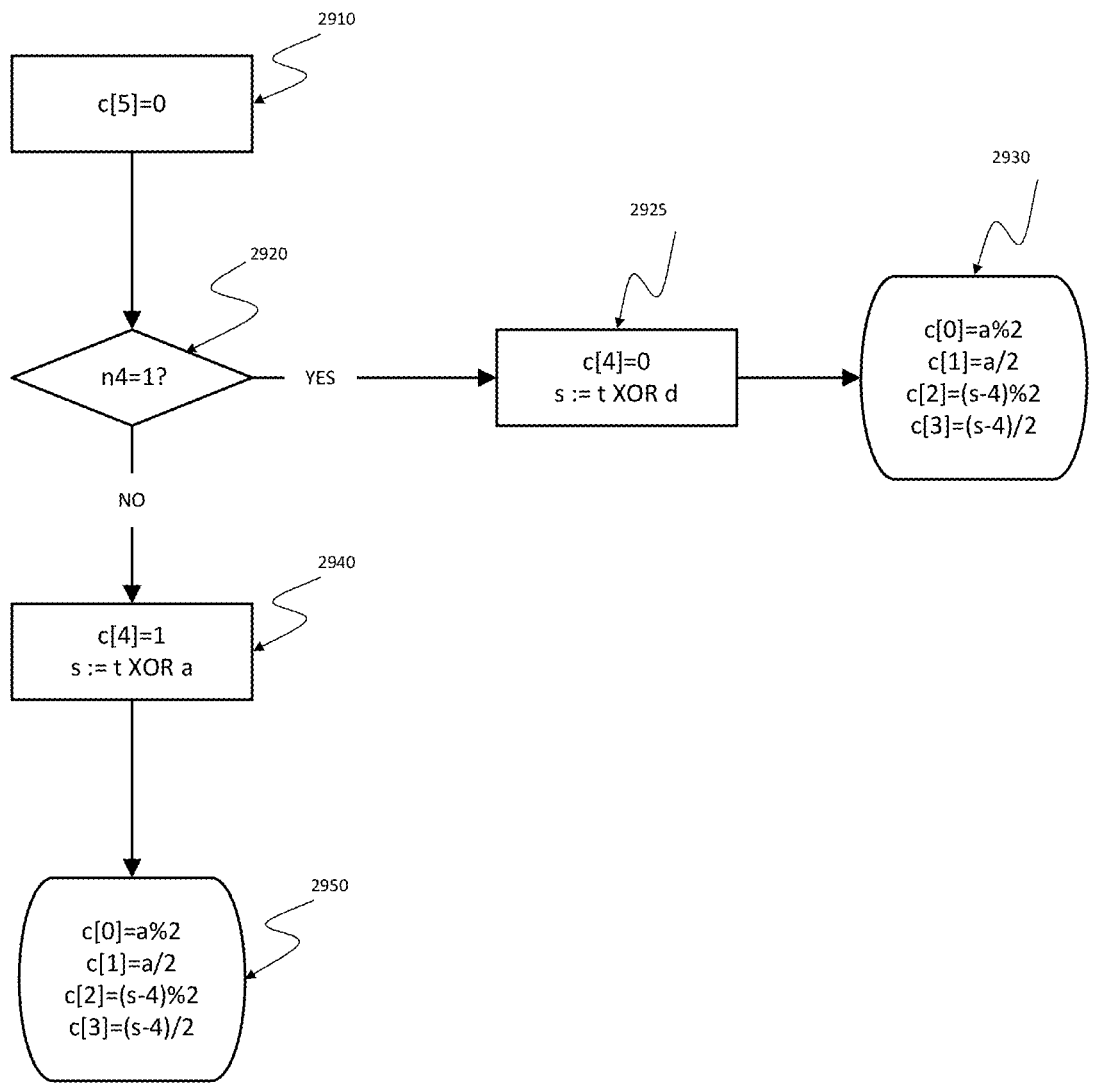

A decoding procedure is now described with reference to FIGS. 27 through 29. The input to the decoding procedure in FIG. 27 is a sequence of four values a, b, e, d, which are the positions in which the input vector y is negative. The output of this procedure is a vector (c[0], . . . , c[5]) of 6 bits. In Step 2720, several parameters are calculated: n4, the number of those elements in {a,b,e,d} that are strictly larger than 3, t, the XOR of a, b, e, and d, and a parameter x1, which is equal to the second to lowest order bit of t. If n4=2, the value c[5] is recovered to be one in Step 2735, and then a procedure PRC is applied which is further detailed in FIG. 28. If n4 is not 2, then the value of c[5] is recovered to be 0, and then a procedure PRD is applied which is further detailed in FIG. 29. Again, these procedures can be implemented using hardware.

Procedure PRC is now described with reference to FIG. 28. In Step 2810, it is tested whether x1 is zero. If this is the case, then the values of c[0], . . . , c[4] are calculated according to the assignments in Step 2815. If x1 is not zero, then c[4] is recovered to be 1, and it is tested whether b−a=1 and at the same time the lowest order bit of b is equal to 1. If that is the case, then the values c[0], . . . , c[3] are recovered according to the assignments in Step 2835. If not, then the values are recovered according to the assignments in FIG. 2840.

Procedure PRD is now described with reference to FIG. 29. The value of c[5] is recovered to be 0 in Step 2910. If n4=1, a test performed in Step 2920, then the value of c[4] is recovered to be zero, and a parameter s is set to be the XOR of t and d in Step 2925. The values of the remaining elements of c are calculated according to the assignments in Step 2930. If n4 is not 1, then the value of c[4] is recovered to be one, and a parameter s is set to be the XOR of t and a, in Step 2940. The values of the remaining components of the vector c are then calculated according to the assignments in Step 2950.

In this setting, the charge calculator may be chosen to be the one outlined in FIG. 15. As should be appreciated, the cell efficiency of this scheme is 0.75, corresponding to storing 6 bits on 8 cells, and its Write Endurance is R. The Write Endurance of this scheme is thus the same as that of differential storage, while its cell efficiency is 1.5 times higher.

Example of Differential Vector Storage of Cell Efficiency 1.5

Another embodiment of the present invention is now described which is a differential vector storage scheme with 8 cells in its fundamental group of cells, on which collectively 12 bits are stored, leading to cell efficiency of 1.5. The code is called the 12B8C code hereinafter. It is a superposition code of two instances of the 6B8C code according to the teachings of Cronie IV.

Figure 30:
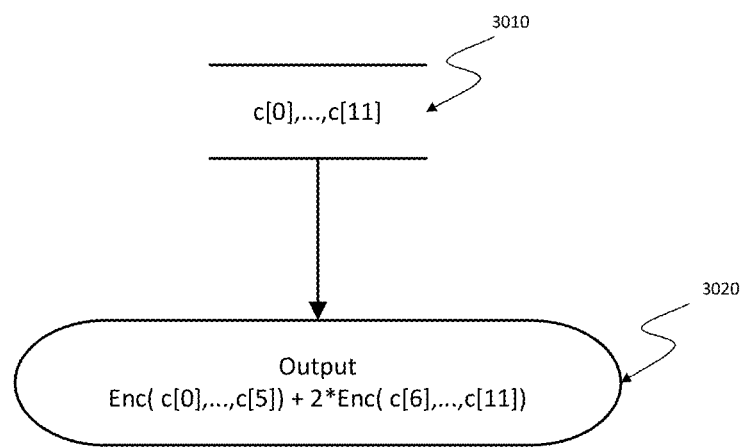

An encoder for the 12B8C code according to one embodiment of the present invention is outlined with reference to FIG. 30. The input to this procedure is a sequence (c[0], . . . , c[11]) of 12 bits. The output is a vector (y[0], . . . , y[8]) obtained as Enc(c[0], . . . , c[5])+2*Enc(c[6], . . . , c[11]), wherein Enc is the encoding procedure for the 6B8C code outlined in FIG. 26. For example, where the input vector to this procedure is [0,1,1,0,1,0, 1,1,0,1,0,0], the output equals that shown in Equation 2, which is equal to that shown in Equation 3.

$$\left[\frac{1}{2}, \frac{1}{2}, -\frac{1}{2}, \frac{1}{2}, -\frac{1}{2}, \frac{1}{2}, -\frac{1}{2}, -\frac{1}{2}\right] + \quad \text{(Eqn. 2)}$$

$$2*\left[-\frac{1}{2}, -\frac{1}{2}, -\frac{1}{2}, \frac{1}{2}, \frac{1}{2}, \frac{1}{2}, -\frac{1}{2}, \frac{1}{2}\right]$$

$$\left[-\frac{1}{2}, -\frac{1}{2}, -\frac{3}{2}, \frac{3}{2}, \frac{1}{2}, \frac{3}{2}, -\frac{3}{2}, \frac{1}{2}\right] \quad \text{(Eqn. 3)}$$

Figure 31:
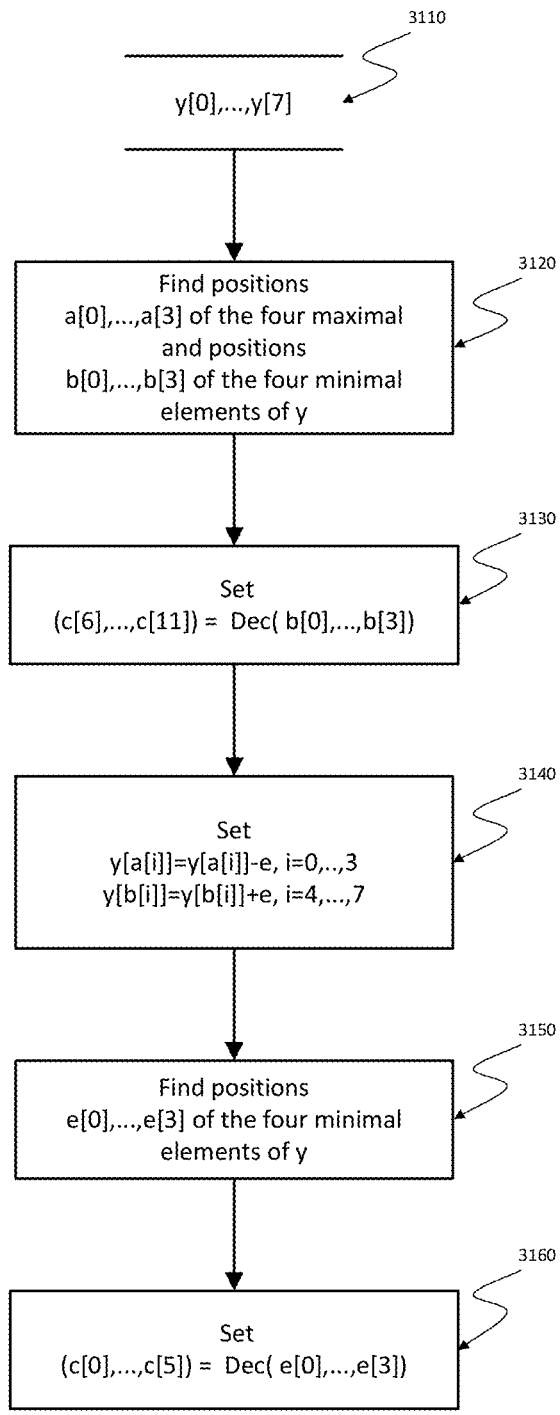

A decoder for the 12B8C code is now described with reference to FIG. 31. The input to the procedure is a vector (y[0], . . . , y[7]). In Step 3120 the positions a[0], . . . , a[3] of the four maximal and the positions b[0], . . . , b[3] of the four minimal elements of y are calculated. These positions already reveal the values c[6], . . . , c[11], which are calculated in Step 3130 as the application of the decoding procedure of FIG. 27 of the 6B8C code on the vector (b[0], . . . , b[3]). Thereafter, in Step 3140 the four largest values of the vector y are reduced by e, and the four smallest values are increased by e, wherein e is the minimal charge increment. Thereafter, in Step 3150 the four smallest positions e[0], . . . , e[3] of the vector y are calculated, and the remaining entries c[0], . . . , c[5] of the vector c are calculated in Step 3160 as an application of the decoder of FIG. 27 on the vector (e[0], . . . , e[3]).

For example, where e=1 and the vector y is a perturbed version of the above vector given as [−0.60, −0.40, −1.55, 1.53, 0.41, 1.58, −1.59, 0.51], then the indices of the four smallest entries of y, i.e., the values b[0], . . . , b[3], are 0,1,2,6, and the indices of the largest four entries of y, i.e., a[0], . . . , a[3] are 3, 4, 5, 7. Application of the decoder in FIG. 27 to the vector [3,4,5,7] gives the bit sequence [1,1,0,1,0,0]. Now we replace y by the vector [−0.60, −0.40, −1.55, 1.53, 0.41, 1.58, −1.59, 0.51]−[−1, −1, −1, 1, 1, 1, −1, 1] which is equal to [0.40, 0.6, −0.55, 0.53, −0.59, 0.58, −0.59, −0.49]. The indices of the four smallest entries of this vector are [2,4,6,7]. Application of the decoder in FIG. 27 to this vector gives the bit vector [0,1,1,0,1,0], and the 12-bit output bit vector is then equal to [0,1,1,0,1,0, 1,1,0,1,0,0] which is the correct sequence. As can be seen from this example, the 12B8C code has some tolerance against noise.

Differential Vector Storage with Permutation Modulation Codes

The previous examples demonstrate the use of permutation modulation (PM) codes and super position PM codes as described in Cronie IV for vector differential storage. As described in [Slepian], a PM code of length n is all permutations of a single vector of the form shown in Equation 4, wherein $n_0, n_1, \ldots, n_t$ are positive integers summing up to n. Furthermore, $a_0, a_1, \ldots, a_t$ are real numbers such that Equation 5 is satisfied and $a_0 > a_1 > \ldots > a_t$.

$$x_0 = (\underbrace{a_0, \ldots, a_0}_{n_0} \mid \underbrace{a_1, \ldots, a_1}_{n_1} \mid \ldots \mid \underbrace{a_t, \ldots, a_t}_{n_t}) \quad \text{(Eqn. 4)}$$

$$n_0 a_0 + n_1 a_1 + \ldots + n_t a_t = 0 \quad \text{(Eqn. 5)}$$

The previous condition is not entirely necessary for vector differential storage, and the sum of the entries of the vector $x_0$ can be any fixed number, not necessarily zero. A superposition of two PM codes, as described in Cronie IV, is the code comprising all sums a+b, wherein a and b belong to two, not necessarily distinct, PM codes. A superposition of k PM codes is the code comprising all sums $p_1 + \ldots + p_k$, wherein $p_1, \ldots, p_k$ each belong to given PM codes which are not necessarily distinct.

As can be appreciated by those of ordinary skill in the art, the Write Endurance of a PM code generated by a vector $x_0$ as described above is $R/(a_0-a_t)$. For a superposition of k PM codes, each generated by the vector $x_{0,j} = (a_{0,j}, \ldots, a_{0,j} \mid \ldots \mid a_{t(j),j}, \ldots, a_{t(j),j})$ the Write Endurance is M-T, wherein M is $a_{0,1} + \ldots + a_{0,k}$ and T is $a_{t(1),1} + \ldots, a_{t(k),k}$. Encoding and decoding methods can be devised for PM codes and for permutation PM codes several of which have been described in Cronie II, Cronie III, and Cronie IV.

Figure 37:
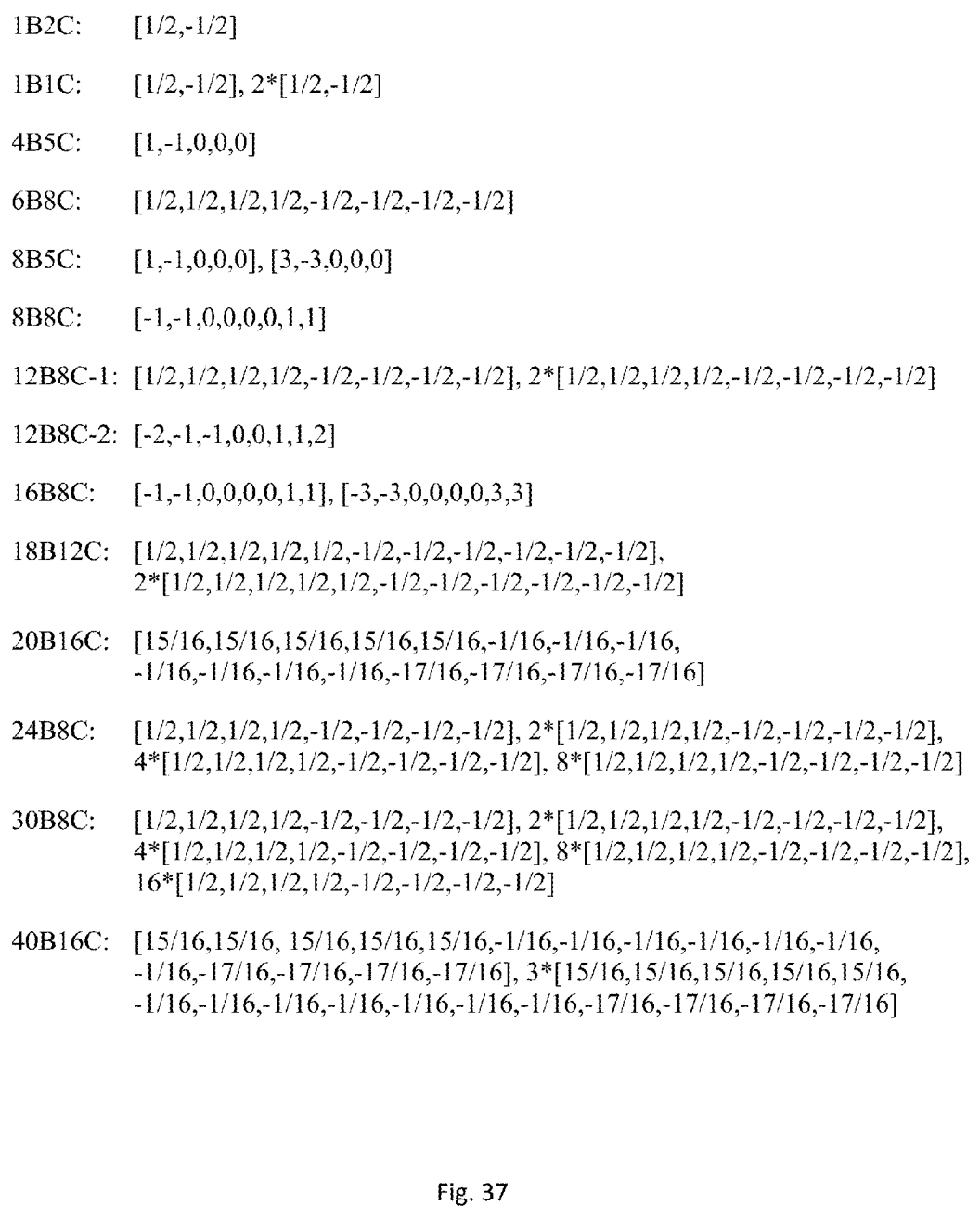

Some examples of PM codes and superposition of PM codes, including the examples above, are illustrated in FIG. 37. In those examples, the code is described by one or more vectors, and this is to be understood that the code is a superposition of PM codes by these vectors. Where there is only one vector, it is to be understood that the code is a PM code generated by that vector, whereas where there is more than one vector, the code will be a superposition of PM codes. The performance of the various schemes is illustrated in Table 1.

TABLE 1

| Scheme | Number of bits | Number of cells | Cell efficiency | Rewrite Endurance |
|---|---|---|---|---|
| 1B2C | 1 | 2 | 0.5 | R |
| 1B1C | 1 | 1 | 1.0 | R/3 |
| 4B5C | 4 | 5 | 0.8 | R/3 |
| 6B8C | 6 | 8 | 0.75 | R |
| 8B5C | 8 | 5 | 1.6 | R/9 |
| 8B8C | 8 | 8 | 1.0 | R/2 |
| 12B8C 1 | 12 | 8 | 1.5 | R/3 |
| 12B8C 2 | 12 | 8 | 1.5 | R/5 |
| 16B8C | 16 | 8 | 2.0 | R/6 |
| 18B12C | 18 | 12 | 1.5 | R/3 |
| 20B16C | 20 | 16 | 1.25 | R/2 |

TABLE 1-continued

| Scheme | Number of bits | Number of cells | Cell efficiency | Rewrite Endurance |
|---|---|---|---|---|
| 24B8C | 24 | 8 | 3.0 | R/19 |
| 30B8C | 30 | 8 | 3.75 | R/31 |
| 32B16C | 32 | 16 | 2.0 | R/6 |
| 40B16C | 40 | 16 | 2.5 | R/7.5 |

Examples are now provided for cell charges of the 4B5W and 8B8W codings, with reference to FIGS. 32-*a*, 32-*b*, and 33-*a* through 33-*d*. The encoding procedure described in Cronie II for the 4B5C coding maps the bit sequence [0,1,1,0] to the vector [1,0,−1,0,0]. The charge levels of the 5 cells for this vector is given in FIG. 32-*a*. These levels are given by [2*e, e,0e,e] wherein e is the minimal charge increment. Changing the contents of these cells to [1,1,0,1], which corresponds to the vector [−1,0,0,1,0], changes the charge levels to [2*e, 3*e, 3*e, 4*e, 3*e]. The procedure for calculating these charge levels is the one in given in FIG. 15. As can be seen, the average charge increase per cell in every write operation is at most 2*e.

An example for the operation of the 8B8C coding is given in FIGS. 33-*a* through 33-*d*. An encoding procedure for the 8B8C coding is given in Cronie III. According to the teachings of Cronie III the encoding of the bit vector [0,1,0,0,1,1, 1,1] is the vector [1,−1,0,−1,0,0,0,1] which, using the procedure of FIG. 15, leads to the charge levels [2*e,0,e,0,e,e,e, 2*e], as given in FIG. 33-*a*. In FIG. 33-*b* the bit representation of the 8 cells is changed to [0,1,1,0,0,0,0,0] corresponding to the vector [−1,1,0,−1,1,0,0,0], giving rise to the charge levels [2*e,4*e,3*e,2*e,4*e,3*e,3*e,3*e]. In FIG. 33-*c* the bit representation has changed to [1,1,0,1,1,0,1,0] which corresponds to the vector [−1, −1, 1, 0, 0, 1, 0, 0] which according to the procedure of FIG. 15 gives the charges [4*e,4*e,6*e, 5*e,5*e,6*e,5*e,5*e]. Similarly, in FIG. 33-*d* the representation of the bit sequence [1,1,0,0,0,1,1,0] which corresponds to the vector [1,0,0,−1,0,1,−1,0] gives rise to the charge levels [7*e,6*e,6*e,5*e,6*e,7*e,5*e,6*e].

Combination with Inner and Outer ECC

Figure 34:
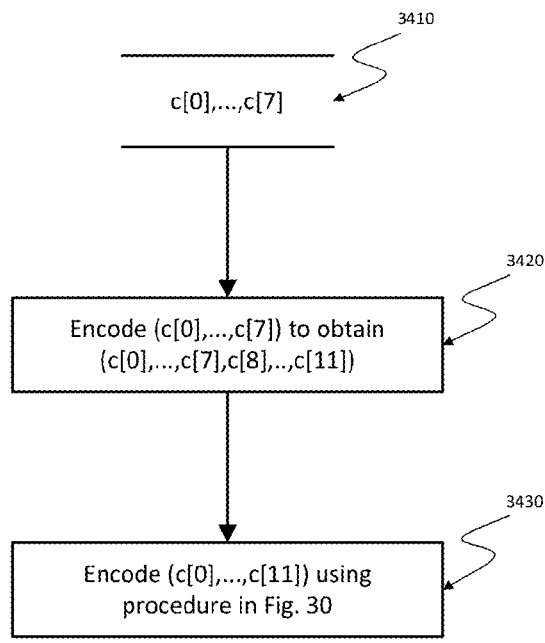

The methods described herein can be combined with an inner error-correcting code ("ECC") to provide a higher reliability of the cells. The ECC unit can be combined with the encoding unit 610 directly. An example is now provided with reference to the 12B8C code described above, and FIG. 34. The input to the procedure is a sequence of 8 bits (c[0], . . . , c[7]). In Step 3420 this sequence is encoded using a systematic shortened Hamming code of length 12 and dimension 8 to produce the sequence (c[0], . . . , c[11]). Thereafter, in Step 3430, this new sequence is encoded according to the encoding procedure of the 12B8C code given in FIG. 30.

Figure 35:
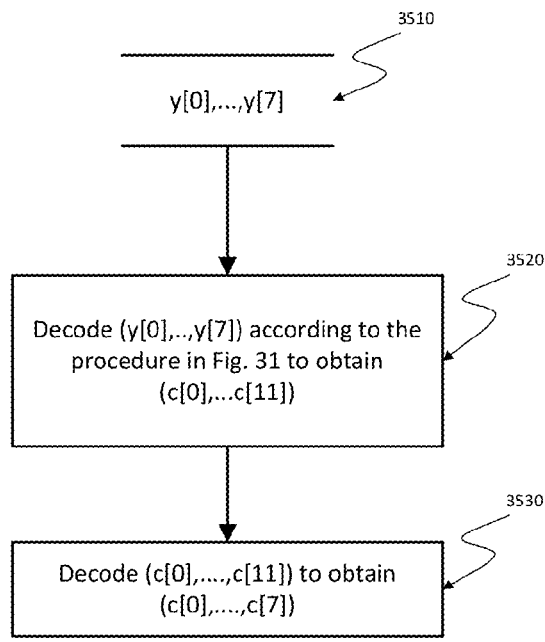

A corresponding decoder is given in FIG. 35. On input (y[0], . . . , y[7]) in Step 3510, the procedure decodes the input vector using the procedure of FIG. 31 to obtain a 12-bit vector (c[0], . . . , c[11]). This bit vector is then decoded in Step 3530 using a decoding procedure for the shortened Hamming code which can correct at least one error, to obtain the output sequence (c[0], . . . , c[7]). Note that because of possible errors, this output sequence is not necessarily the first 8 entries of the vector obtained in Step 3520.

Figure 1:
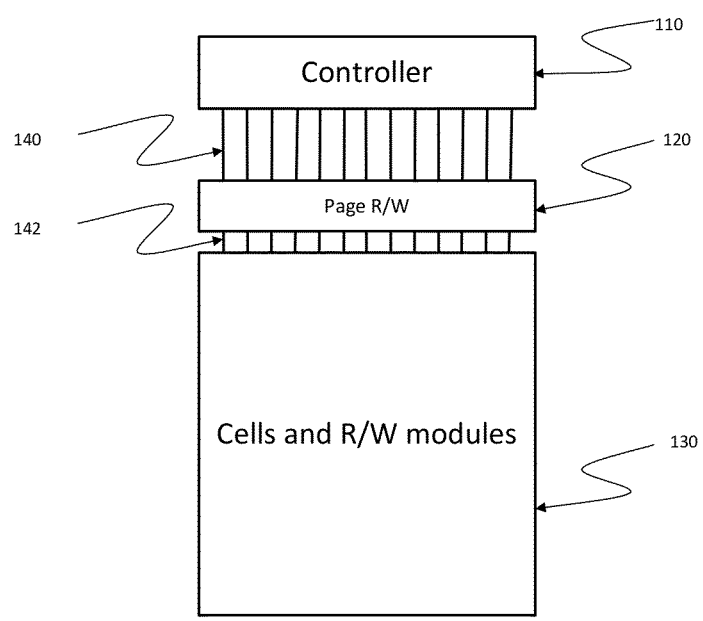
Figure 2:
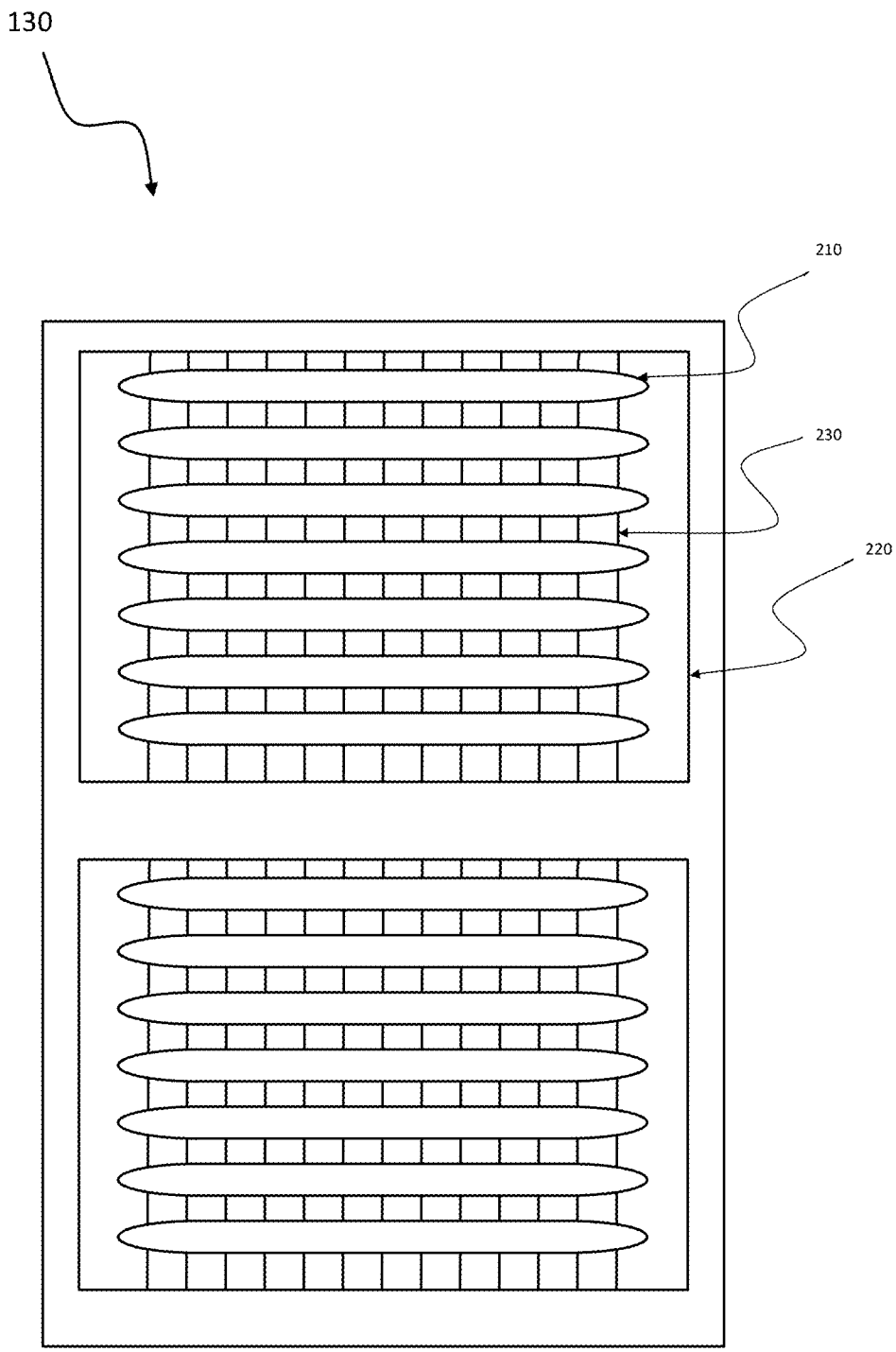
Figure 3:
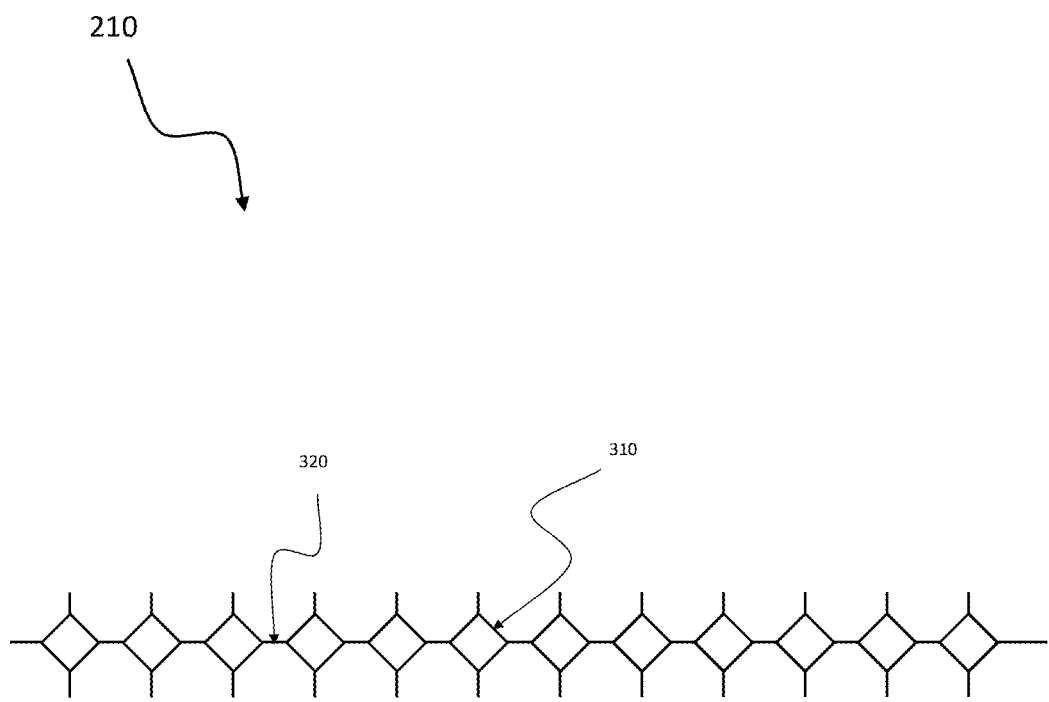
Figure 4:
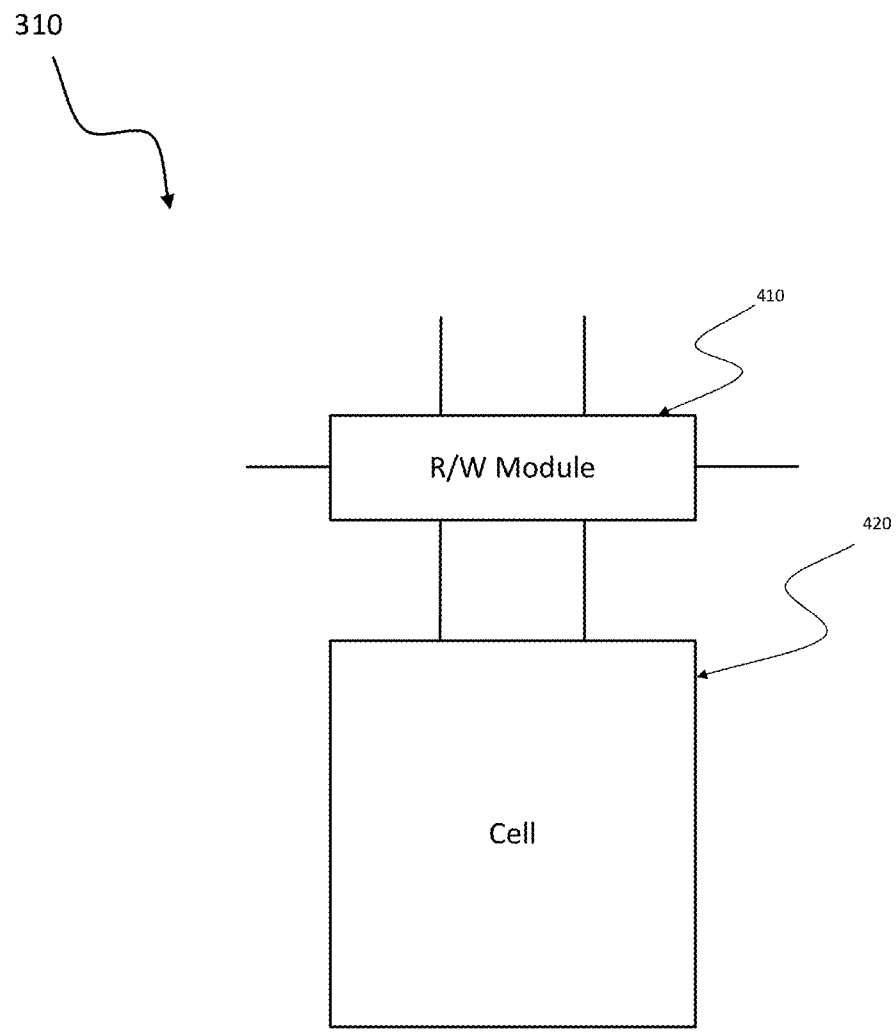

The schemes presented in this disclosure that might be used in memory devices and system can also be combined with outer ECC techniques. An exemplary embodiment is described with reference to FIGS. 36-*a* and 36-*b*. Specifically, in FIG. 36-*a* the Page R/W unit 120 of FIG. 1 may comprise an Outer Encoder unit 3620 whose task is to encode the input bits given in 3610 using an outer error-correcting code. The outer error-correcting code can be a binary code, or it can be a code defined over a larger alphabet. Specifically when outer ECC is combined with inner ECC, the outer ECC code may be chosen to be a non-binary code, for example a Reed-Solomon code, in order to provide better resilience to errors. Once the outer encoder unit 3620 has encoded the bits, these bits are forwarded to the encoder units 610 for the computation of encoded information that will be eventually stored in the cells. Similarly, in FIG. 36-*b*, the decoders 620 decode the received information into bits, or sequences of bits, and these bits are forwarded to the outer decoder 3640 which calculate the output bits 3630. The outer decoder may be part of a page R/W unit, such as unit 120 shown in FIG. 1.

An example of a combined inner and outer ECC is now provided with reference to the code 30B8C. The inner encoder takes as input 24 bits, and uses an extended shortened Hamming code of dimension 24 and length 30 to compute 30 bits, which are then stored on 8 cells using an encoder for the 30B8C code. This code is a superposition of 5 copies of the 6B8C code. The outer encoder may receive 4096 bits, corresponding to a full page of 512 bytes, and encode it using three interleaved Reed-Solomon codes each of length 181 over GF(256) which corresponds to 4344 bits. These bits are grouped into 181 groups of size 24, and each group is encoded using a shortened extended Hamming code to produce 30 bits. These bits are encoded using an encoding procedure for the 30B8C code and stored into a total of 181*8=1448 cells.

The combined cell efficiency of this scheme is 2.82, and the combination of the outer and inner coding can provide up to 5*3*8=120 bit errors: the outer RS-code is capable of correcting 5 symbol errors, and because of the interleaving it can, in the best case, correct 15 byte errors, which again in the best case may correspond to 120 bit errors. If the redundant part of RS-code is stored separately (which is the case for many flash devices), then this scheme leads to a cell-efficiency of 3, with an endurance that is better than that of a single level flash device.

The above description is not meant to be restrictive. Many other methods and combinations of ECC schemes with encoders according to the various embodiments of the present invention are possible and should be apparent to those of moderate skill in the art upon study of this disclosure. For example, the outer code may be a binary code with an efficient encoding and decoding procedure, such as an LDPC code. It might also be a code derived from curves on a finite field (AG-code), or another type of code known to be well-suited for the application in memory storage.

What is claimed is:

1. A method of storing data on a non-volatile memory having a plurality of cells, each of which holds a physical state indicated by a held quantity that can be written to the cell and read from the cell, at least approximately, the method comprising:
    associating cells of the plurality of cells into a plurality of fundamental cell groups, each fundamental cell group comprising more than one cell;
    receiving a first set of physical signals representing the data to be stored;
    forming a second set of physical signals by encoding the first set of physical signals using a neutral differential storage code; and
    changing the physical state of the cells of one of the fundamental cell groups based on the second set of physical signals.

2. The method of claim 1, wherein forming the second set of physical signals further comprises:

dividing the first set of physical signals into groups, one for each fundamental cell group;

for each of the fundamental cell groups for the first set of physical signals, forming an outer error correcting set of physical signals based, at least in part, on the first set of physical signals;

for each group of outer error correcting sets of physical signals, forming an inner error correcting set of physical signals based, at least in part, on the outer error correcting set of physical signals;

forming the second set of physical signals based, at least in part, on the inner error correcting set of physical signals.

3. The method of claim 2, wherein the inner error correcting set of physical signals relates to the outer error correcting set of physical signals according to an error-correcting code.

4. The method of claim 1, wherein storing the second set of physical signals further comprises:

for each of the second sets of physical signals, forming a third set of physical signals wherein values within the third set of physical signals are nonnegative and wherein the number of signals within the third set of physical signals is equal to the number of cells within a fundamental group;

associating the signals in the third set of physical signals with the cells in a fundamental group; and for each of the signals in the third set of physical signals, adding a charge to the associated cell in a fundamental group.

5. The method of claim 4, wherein the signals within the third set of physical signals are multiples of a minimum charge increment.

6. The method of claim 1, wherein the number of cells within a fundamental group is two.

7. The method of claim 1, wherein the number of cells within a fundamental group is larger than two.

8. The method of claim 1, wherein the neutral differential storage code is a permutation modulation code.

9. A method of reading data from a non-volatile memory having a plurality of cells, each of which holds a charge that can be written to the cell and read from the cell, at least approximately, the method comprising:

forming a first set of physical signals by reading the charges of the cells in a fundamental cell group;

forming a second set of physical signals based, at least in part, on the first set of physical signals, wherein the second set of physical signals relate to the first set of physical signals according to a neutral differential storage code; and forming a third set of physical signals based, at least in part, on the second set of physical signals, wherein the third set of physical signals corresponds to the data stored in the cells within the fundamental cell group.

10. The method of claim 9, wherein the step of forming the third set of physical signals further comprises:

forming a fourth set of physical signals based, at least in part, on the second set of physical signals; and forming the third set of physical signals based, at least in part, on several fourth sets of physical signals.

11. The method of claim 10, wherein forming the first set of physical signals further comprises:

computing an average charge of the cells in a fundamental cell group; and subtracting the average charge from the charges of the cells within the fundamental group.

12. The method of claim 10, wherein forming the second set of physical signals comprises applying a permutation modulation decoder to the first set of physical signals.

13. The method of claim 10, wherein the third set of physical signals is equal to the second set of physical signals.

14. The method of claim 10, wherein the third set of physical signals is obtained from the second set of physical signals using a decoder for an error-correcting code.

15. The method of claim 10, wherein a fifth set of physical signals is equal to the fourth set of physical signals and the fifth set of physical signals is obtained from the fourth set of physical signals using a decoder for an error-correcting code.

16. A system for storing information on a non-volatile memory comprising:

a non-volatile memory divided into a plurality of storage cells;

means for generating codewords from a neutral differential storage code; and means for storing the generated codewords into the plurality of storage cells.

17. A method of storing data on a non-volatile memory having a plurality of cells, each of which holds a level of charge, the method comprising:

receiving a sequence of bits representing the data to be stored in a fundamental group of cells;

encoding the sequence of bits into a vector of values using a neutral differential storage code;

reading the level of charge on each of the cells in the fundamental group;

calculating a charge increment for each of the cells in the fundamental group based on the vector of values and the level of charge; and adding charges into the cells in the fundamental group based on the calculated charge increment.

18. The method of claim 17, wherein the neutral differential storage code is a permutation code.

19. The method of claim 17, further comprising generating the sequence of bits representing the data to be stored by applying an error-correcting code to an input sequence of bits.

20. The method of claim 17, wherein the adding of charges is performed without erasing the cells.

* * * * *